United States Patent
Rabkin et al.

(10) Patent No.: US 11,335,790 B2
(45) Date of Patent: May 17, 2022

(54) FERROELECTRIC MEMORY DEVICES WITH DUAL DIELECTRIC CONFINEMENT AND METHODS OF FORMING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 94 days.

(21) Appl. No.: 16/577,176

(22) Filed: Sep. 20, 2019

(65) Prior Publication Data
US 2021/0091204 A1 Mar. 25, 2021

(51) Int. Cl.
| | | |
|---|---|---|
| *H01L 29/51* | (2006.01) | |
| *H01L 27/11514* | (2017.01) | |
| *H01L 21/28* | (2006.01) | |
| *H01L 29/417* | (2006.01) | |

(52) U.S. Cl.
CPC ...... *H01L 29/516* (2013.01); *H01L 27/11514* (2013.01); *H01L 29/40111* (2019.08); *H01L 29/41725* (2013.01)

(58) Field of Classification Search
CPC ............. H01L 29/516; H01L 29/40111; H01L 29/41725; H01L 27/11514; H01L 27/11595; H01L 27/11587; H01L 27/11597
USPC ........................................................ 257/295
See application file for complete search history.

(56) References Cited

U.S. PATENT DOCUMENTS

| | | | |
|---|---|---|---|
| 9,780,108 B2 | 10/2017 | Rabkin et al. | |
| 9,876,025 B2 | 1/2018 | Rabkin et al. | |
| 9,941,299 B1 | 4/2018 | Chen et al. | |
| 2014/0070290 A1 | 3/2014 | Inumiya et al. | |
| 2015/0171183 A1 | 6/2015 | Sakai et al. | |
| 2017/0148811 A1* | 5/2017 | Zhang | H01L 27/11519 |
| 2018/0102374 A1* | 4/2018 | Chavan | H01L 28/55 |
| 2018/0138194 A1 | 5/2018 | Shigemura et al. | |

(Continued)

FOREIGN PATENT DOCUMENTS

KR  10-2018-0059271 A  6/2018

OTHER PUBLICATIONS

Boscke et al., "Ferroelectricity in hafnium oxide thin films", Sep. 8, 2011, Appl. Phys. Lett. 99, Oct. 29, 2003 (Year: 2011).*

(Continued)

*Primary Examiner* — Dao H Nguyen
(74) *Attorney, Agent, or Firm* — The Marbury Law Group PLLC

(57) ABSTRACT

A semiconductor structure contains a semiconductor channel extending between a source region and a drain region, at least one gate electrode, a ferroelectric material portion located between the semiconductor channel and the at least one gate electrode, a front-side gate dielectric located between the ferroelectric material portion and the semiconductor channel, and a backside gate dielectric located between the ferroelectric material portion and the at least one gate electrode. The front-side gate dielectric and the backside gate dielectric have a dielectric constant greater than 7.9 and a band gap greater than a band gap of the ferroelectric material portion.

15 Claims, 33 Drawing Sheets

(56) References Cited

U.S. PATENT DOCUMENTS

| | | | | |
|---|---|---|---|---|
| 2018/0166453 A1* | 6/2018 | Muller | | H01L 28/40 |
| 2018/0337055 A1* | 11/2018 | Yamaguchi | | H01L 21/02189 |
| 2018/0358380 A1* | 12/2018 | Yoo | | H01L 29/40111 |

OTHER PUBLICATIONS

Notification of Transmittal of the International Search Report and Written Opinion of the International Search Authority for International Patent Application No. PCT/US2020/023296, dated Jul. 21, 2020, 10 pages.

Ni, at al."Critical Role of Interlayer in Hf0.5Zr0.5O2 Ferroelectric FET Nonvolatile Memory Performance" IEEE TED vol. 65, No. 6, p. 2461, Jun. 2018, 9 pages.

Eric Bersch, "Energy Level Alignment In Metal/Oxide/Semiconductor and Organic Dye/Oxide Systems", dissertation, Rutgers University, Oct. 2008, 179 pages.

S.Verma, "Tunnel Barrier Engineering For Flash Memory Technology", dissertation, Stanford University, May 2010, 124 pages.

U.S. Appl. No. 16/568,668, filed Sep. 12, 2019, SanDisk Technologies LLC.
U.S. Appl. No. 16/456,736, filed Jun. 28, 2019, SanDisk Technologies LLC.
U.S. Appl. No. 16/454,475, filed Jun. 27, 2019, SanDisk Technologies LLC.
U.S. Appl. No. 16/454,458, filed Jun. 27, 2019, SanDisk Technologies LLC.
U.S. Appl. No. 16/412,764, filed May 15, 2019, SanDisk Technologies LLC.
U.S. Appl. No. 16/291,673, filed Mar. 4, 2019, SanDisk Technologies LLC.
U.S. Appl. No. 16/249,300, filed Jan. 16, 2019, SanDisk Technologies LLC.
U.S. Appl. No. 16/530,256, filed Aug. 2, 2019, SanDisk Technologies LLC.
U.S. Appl. No. 16/457,721, filed Jun. 28, 2019, SanDisk Technologies LLC.
U.S. Appl. No. 16/245,687, filed Jun. 28, 2019, SanDisk Technologies LLC.
U.S. Appl. No. 16/227,889, filed Dec. 20, 2018, SanDisk Technologies LLC.

* cited by examiner

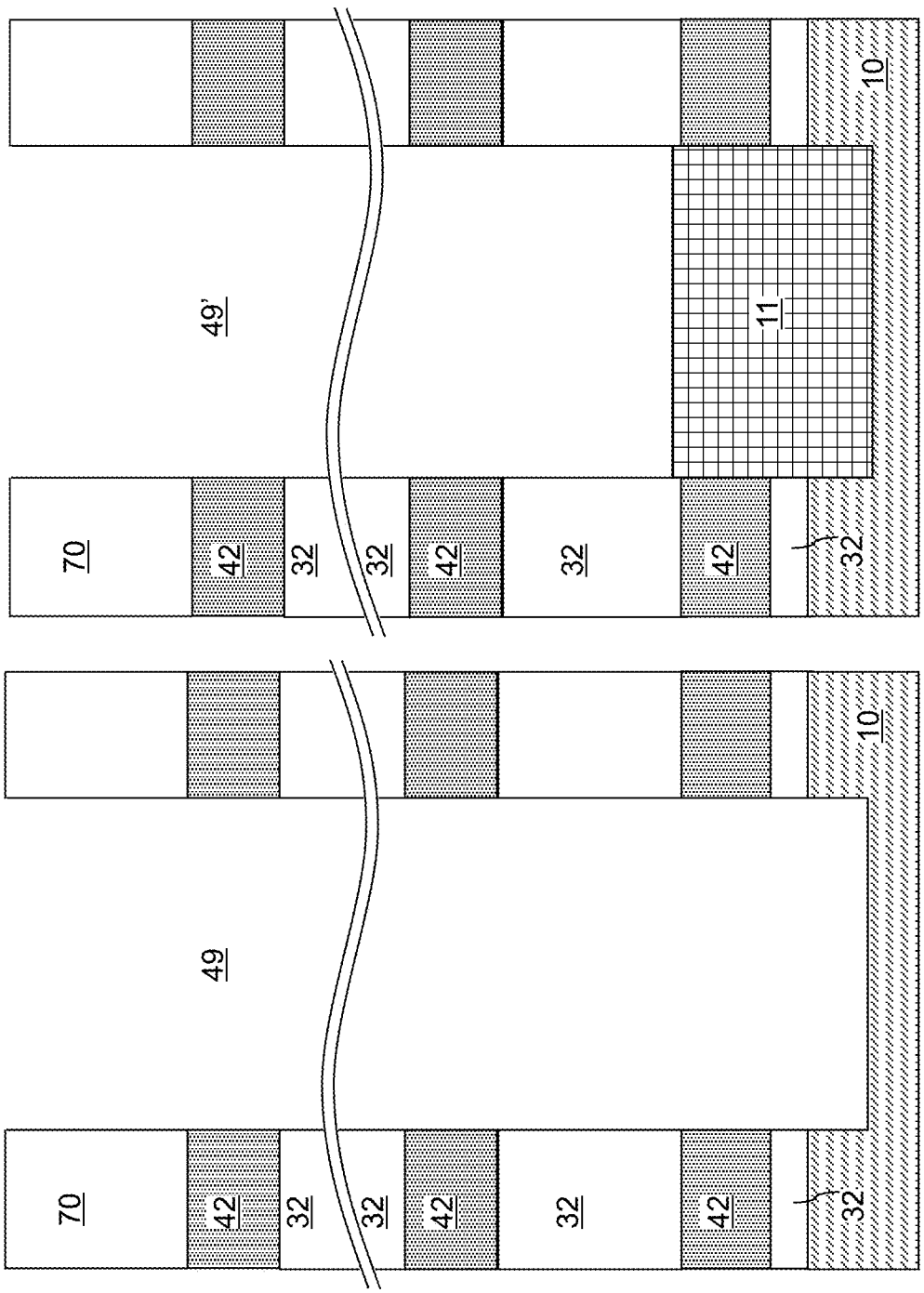

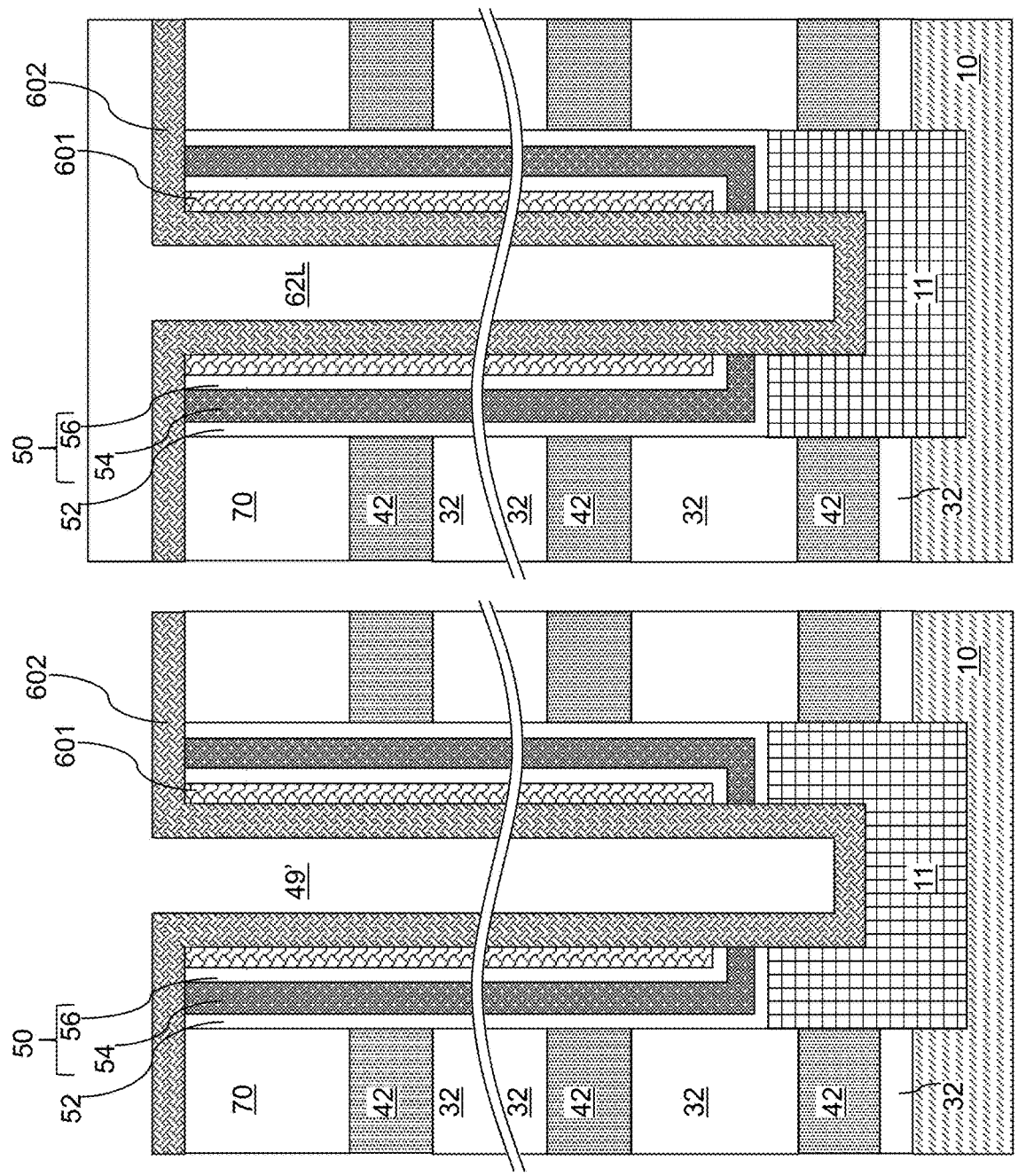

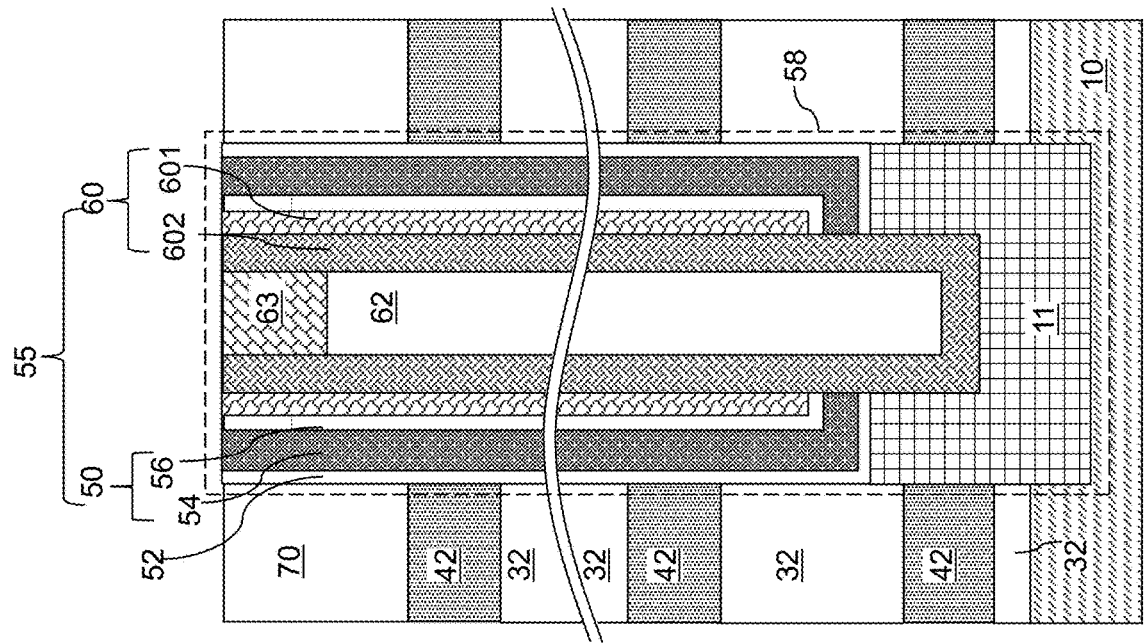
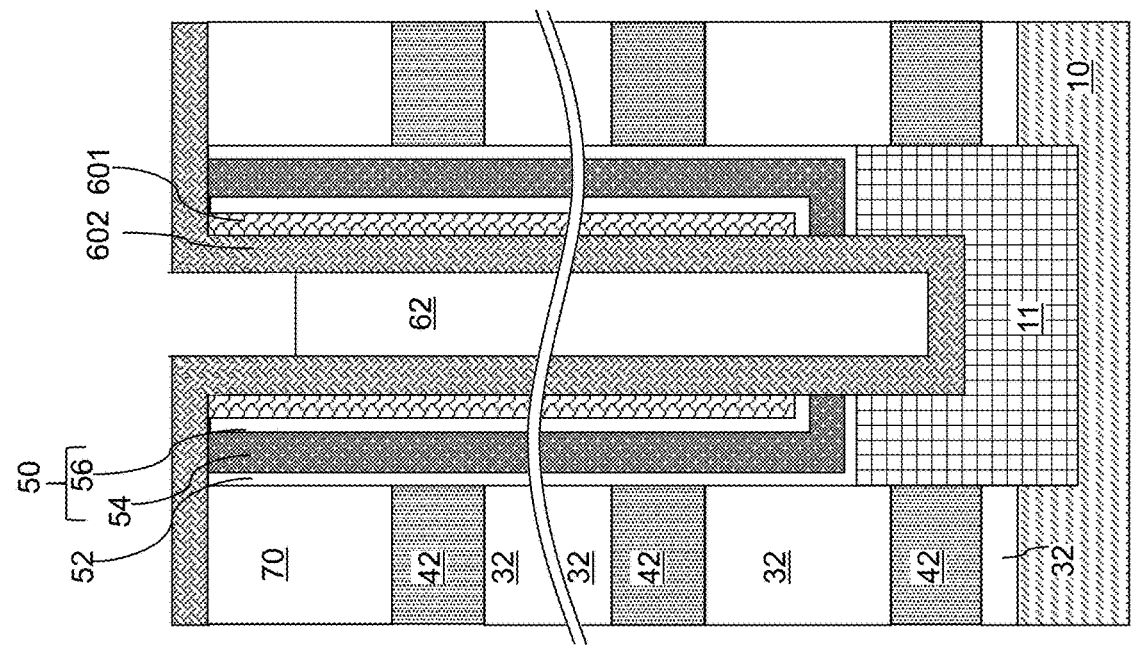

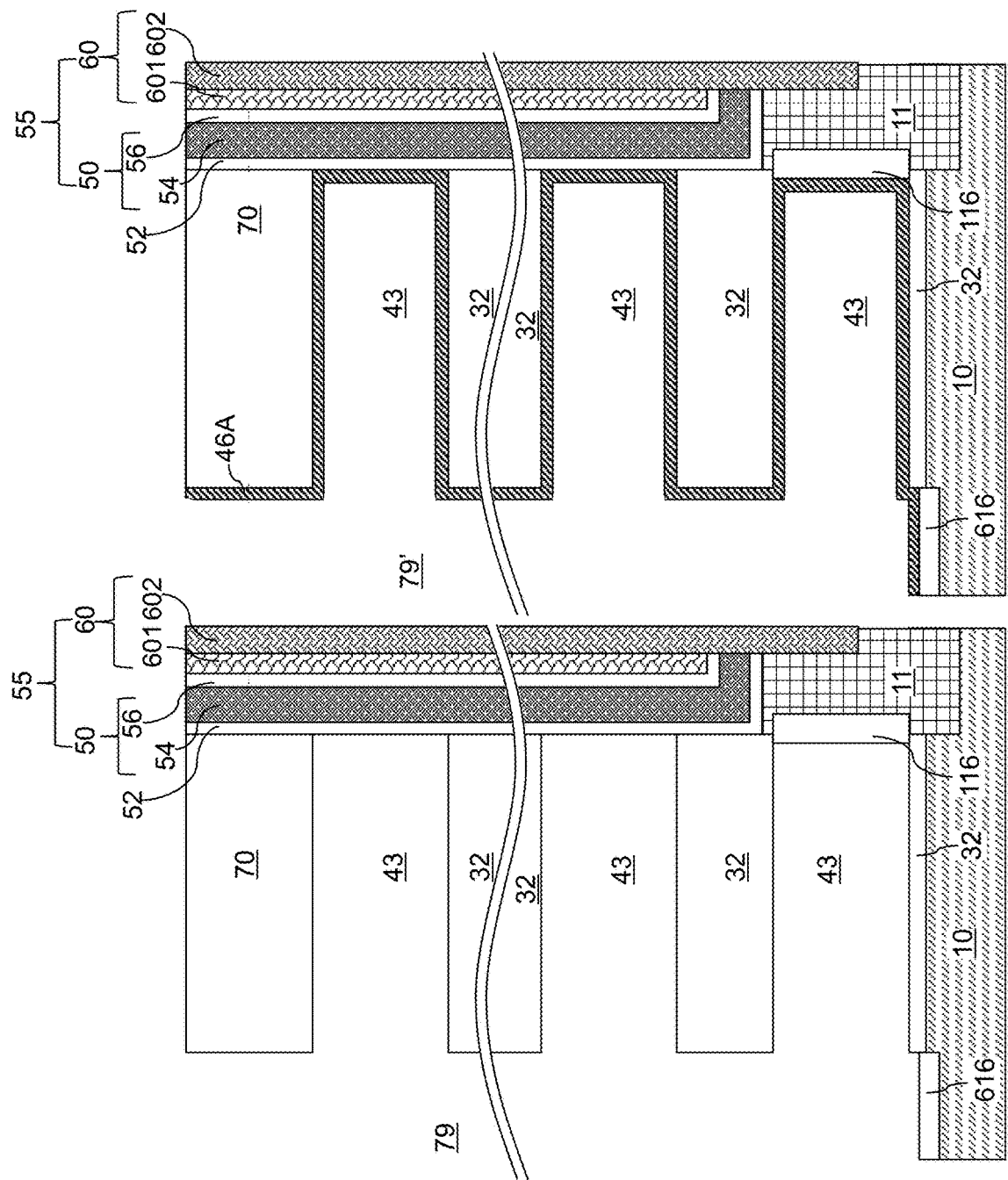

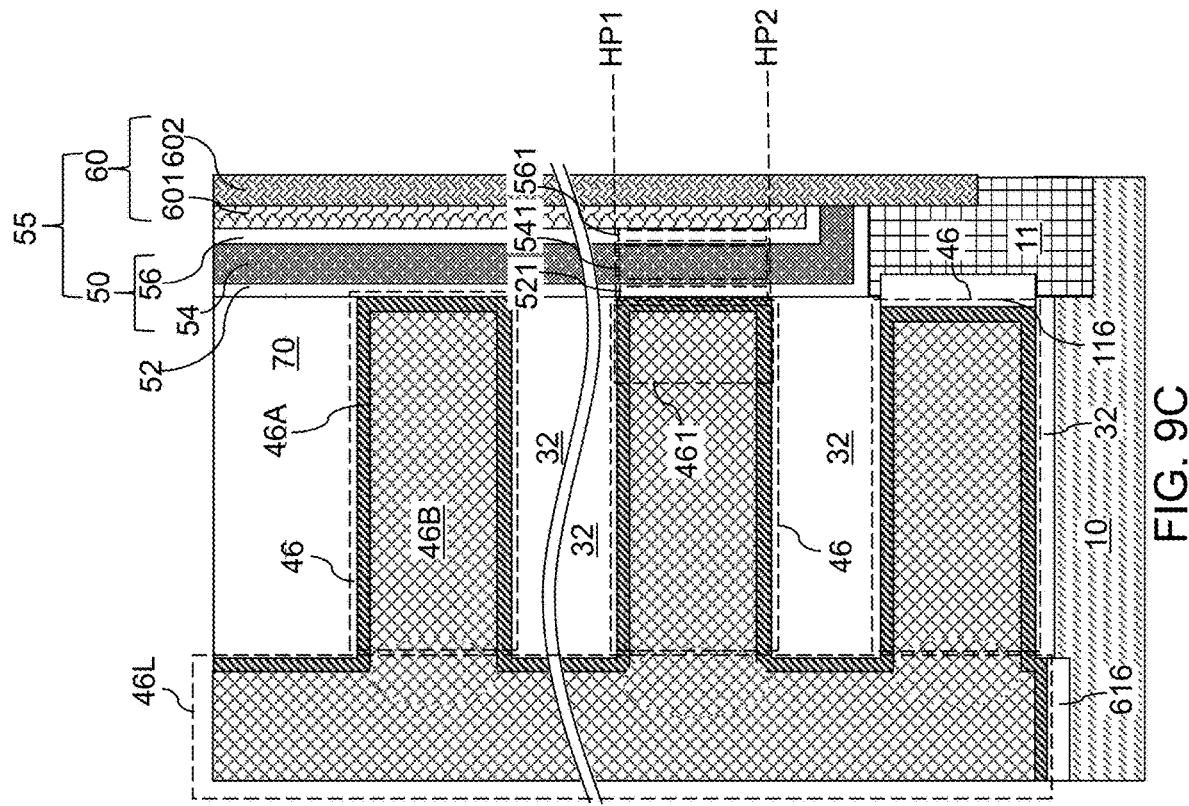

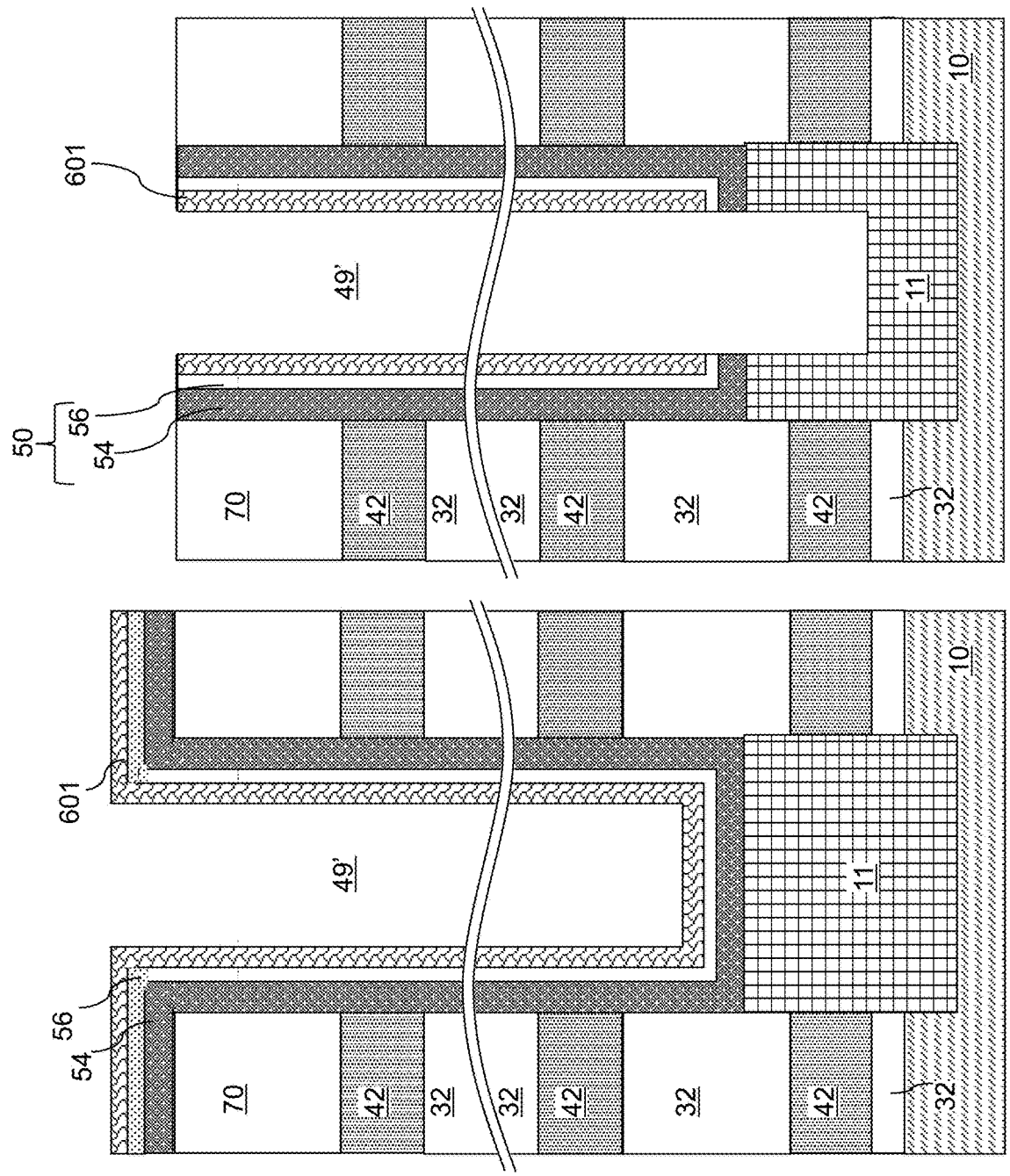

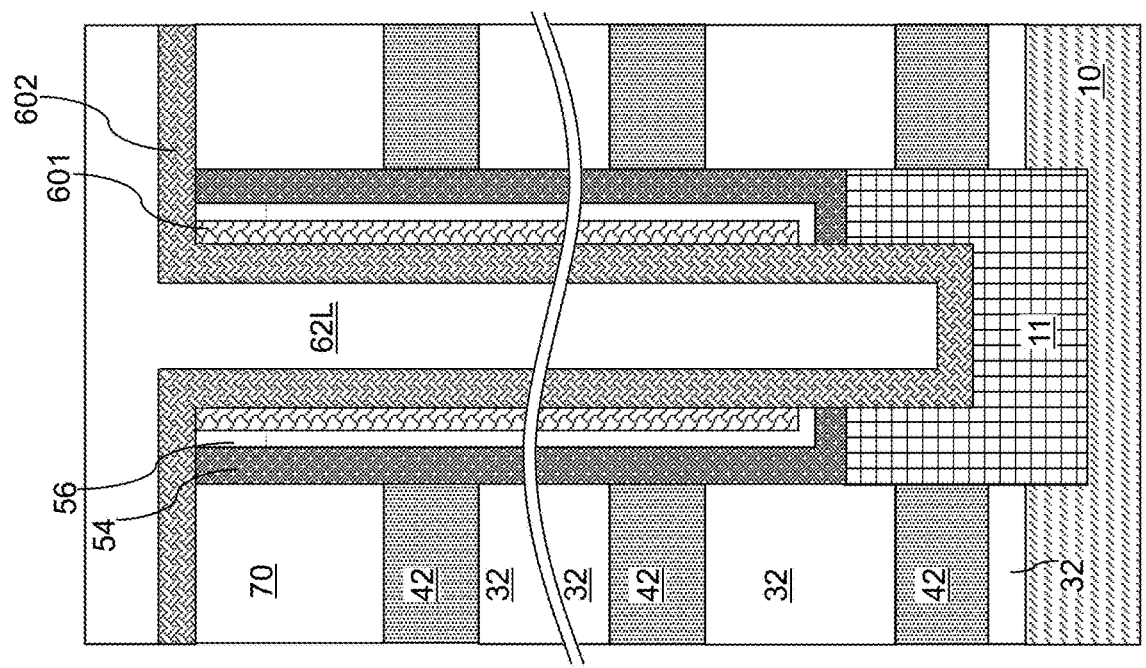
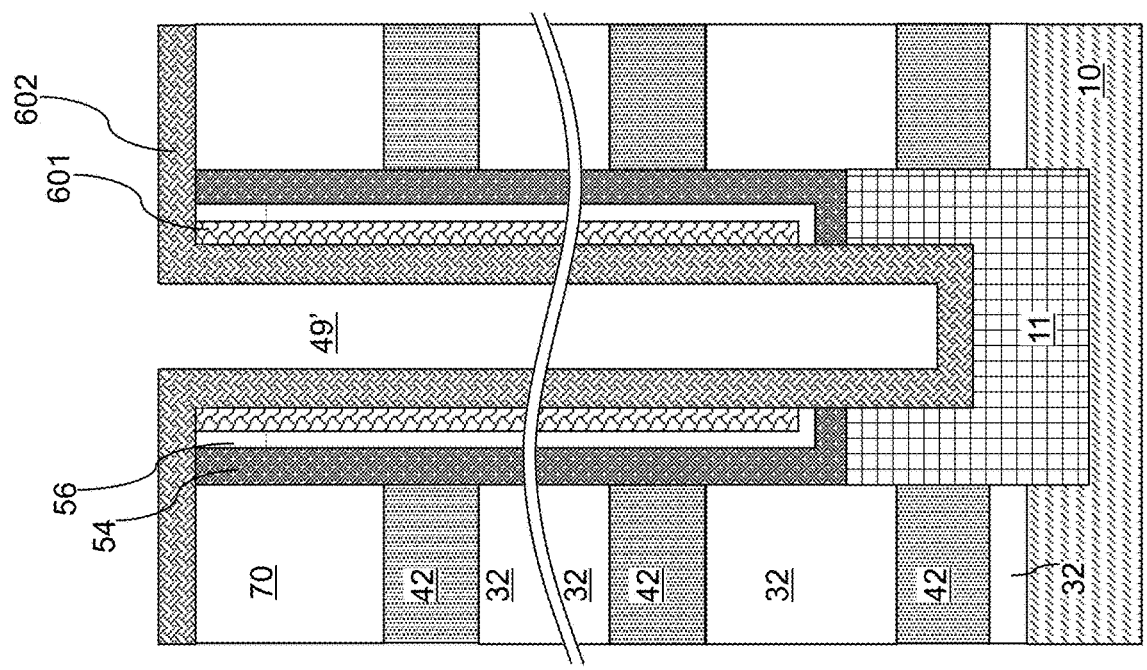

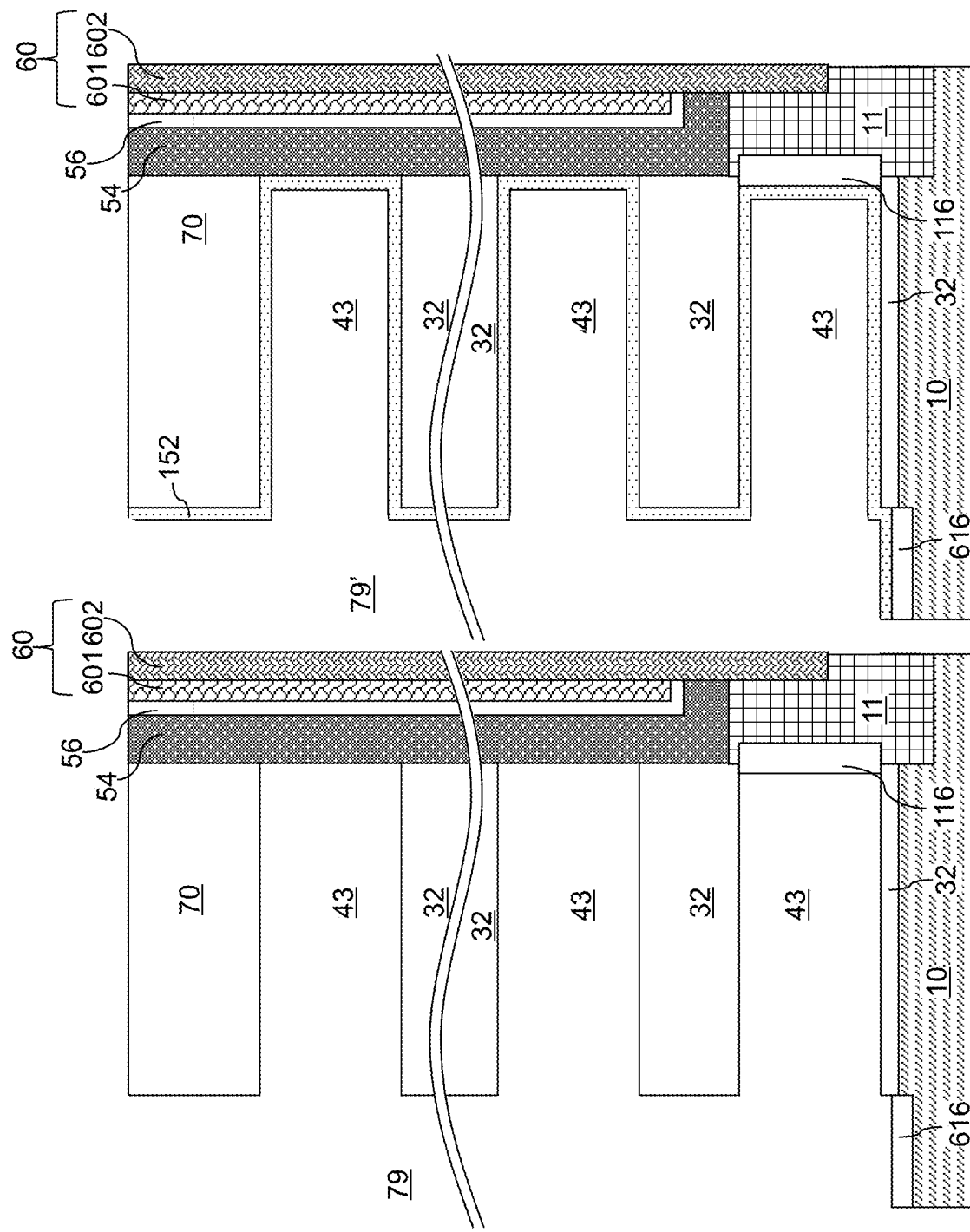

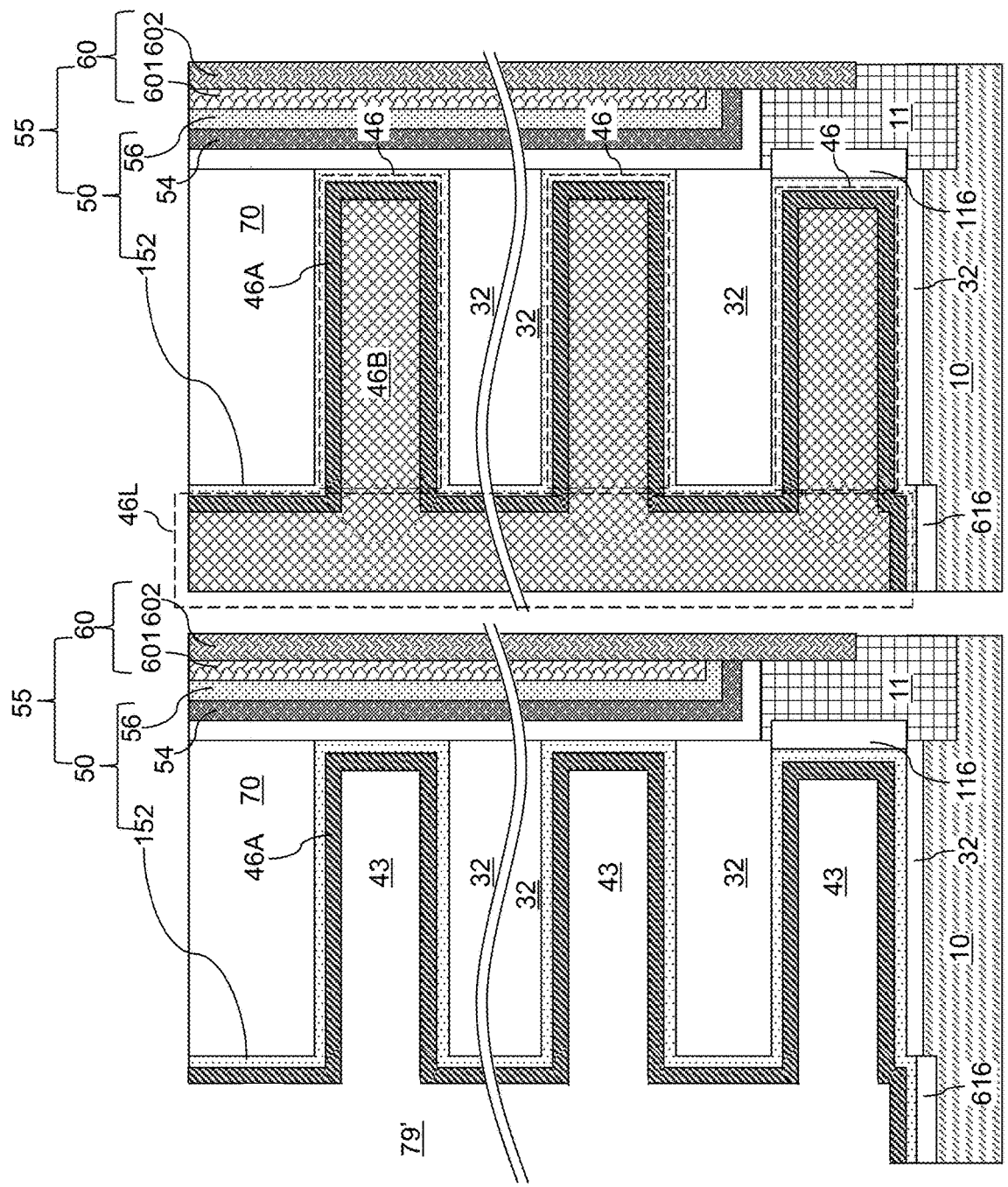

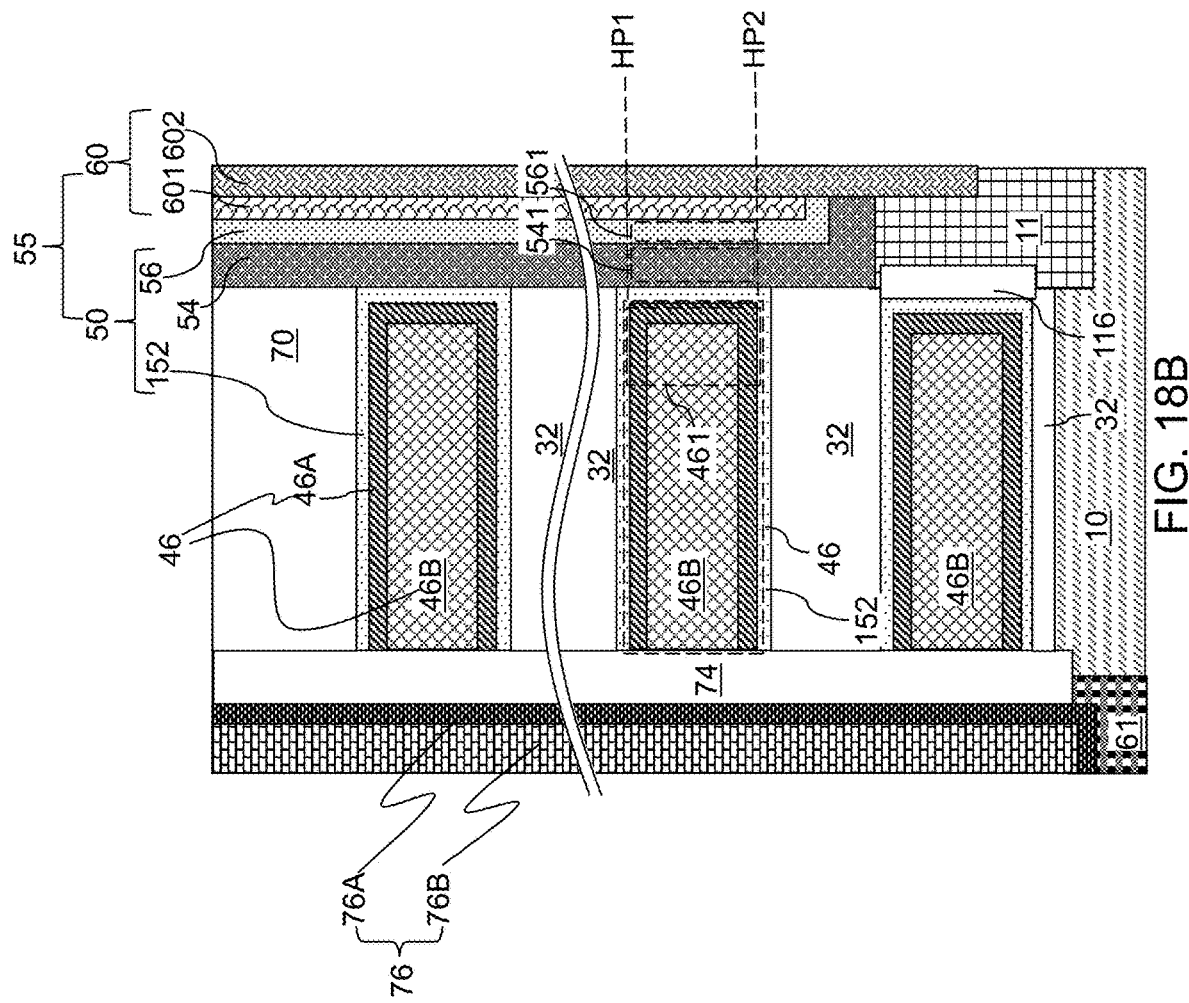

FERROELECTRIC MEMORY DEVICES WITH DUAL DIELECTRIC CONFINEMENT AND METHODS OF FORMING THE SAME

FIELD

The present disclosure relates generally to the field of semiconductor devices, and particularly to ferroelectric memory devices with dual dielectric confinement and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a semiconductor structure contains a semiconductor channel extending between a source region and a drain region, at least one gate electrode, a ferroelectric material portion located between the semiconductor channel and the at least one gate electrode, a front-side gate dielectric located between the ferroelectric material portion and the semiconductor channel, and a backside gate dielectric located between the ferroelectric material portion and the at least one gate electrode. The front-side gate dielectric and the backside gate dielectric have a dielectric constant greater than 7.9 and a band gap greater than a band gap of the ferroelectric material portion.

According to another aspect of the present disclosure, a method of forming a semiconductor structure comprises forming a source region, a drain region, and a semiconductor channel extending between the source region and the drain region, forming a stack including, from one side to another, a front-side gate dielectric, a ferroelectric material portion, and a backside gate dielectric, and forming a gate electrode on the backside gate dielectric, wherein the front-side gate dielectric and the backside gate dielectric have a dielectric constant greater than 7.9 and a band gap greater than a band gap of the ferroelectric material portion.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIGS. 9A-9C are sequential vertical cross-sectional views of a region of the first exemplary structure during formation of electrically conductive layers according to the first embodiment of the present disclosure.

FIGS. 14A-14F are sequential schematic vertical cross-sectional views of a memory opening within a second exemplary structure during formation of a memory stack structure, an optional dielectric core, and a drain region therein according to a second embodiment of the present disclosure.

FIGS. 15A-15D are sequential vertical cross-sectional views of a region of the second exemplary structure during formation of electrically conductive layers according to the second embodiment of the present disclosure.

FIG. 18B is a magnified view of a region of FIG. 18A that includes a portion of a memory opening and a backside trench.

DETAILED DESCRIPTION

Figure 1:
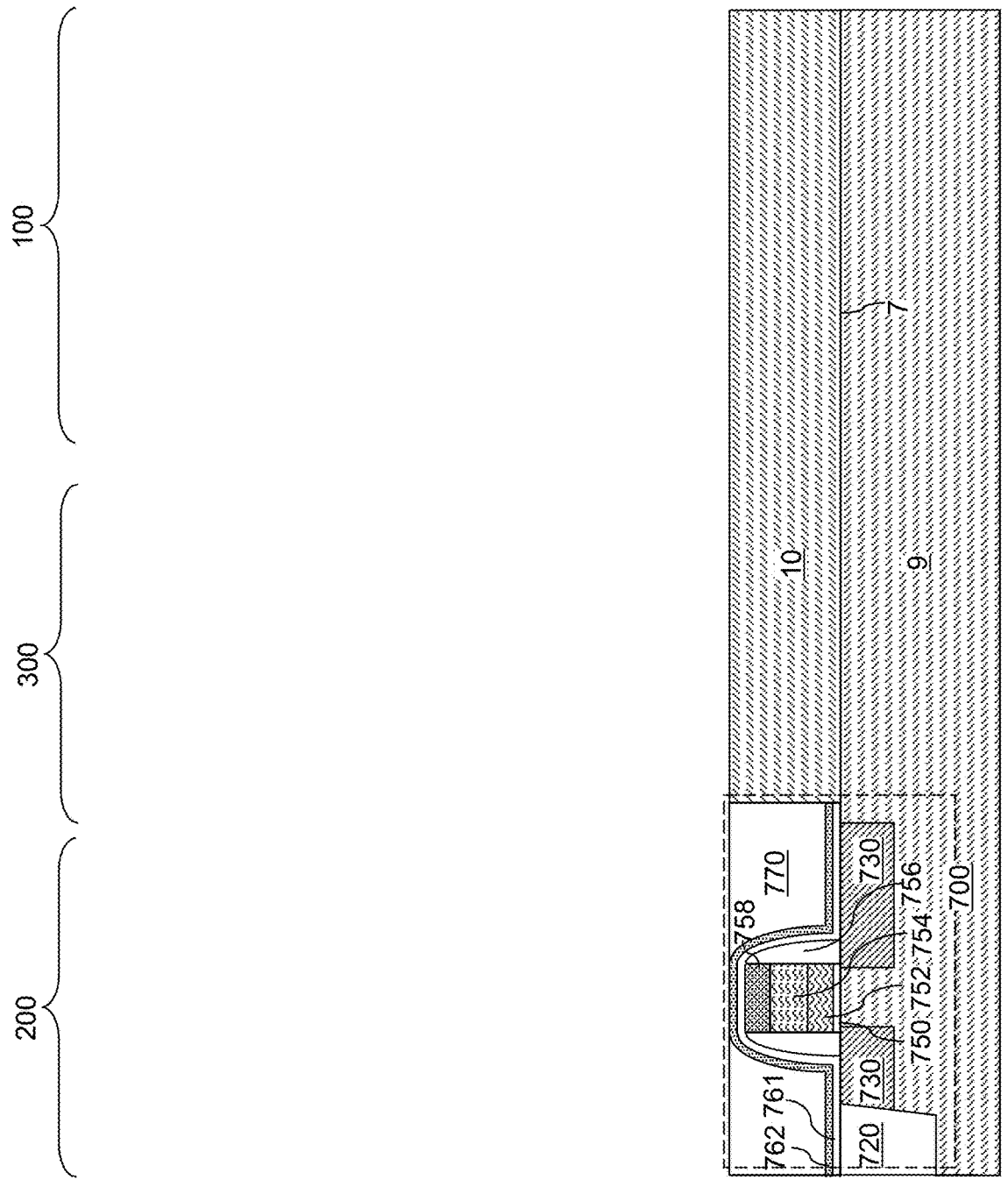
FIG. 1 is a schematic vertical cross-sectional view of a first exemplary structure after formation of at least one peripheral device and a semiconductor material layer according to a first embodiment of the present disclosure.

As discussed above, the present disclosure is directed to ferroelectric memory devices with dual dielectric confinement of the ferroelectric material and methods of manufacturing the same, the various aspects of which are described below. The embodiments of the disclosure may be employed to form various structures including a multilevel memory structure, non-limiting examples of which include three-dimensional ferroelectric memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated, which may be employed, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device may include, for example, field effect transistors. For example, at least one shallow trench isolation structure 720 may be formed by etching portions of the substrate semiconductor layer 9 and depositing a dielectric material therein. A gate dielectric, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, during, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
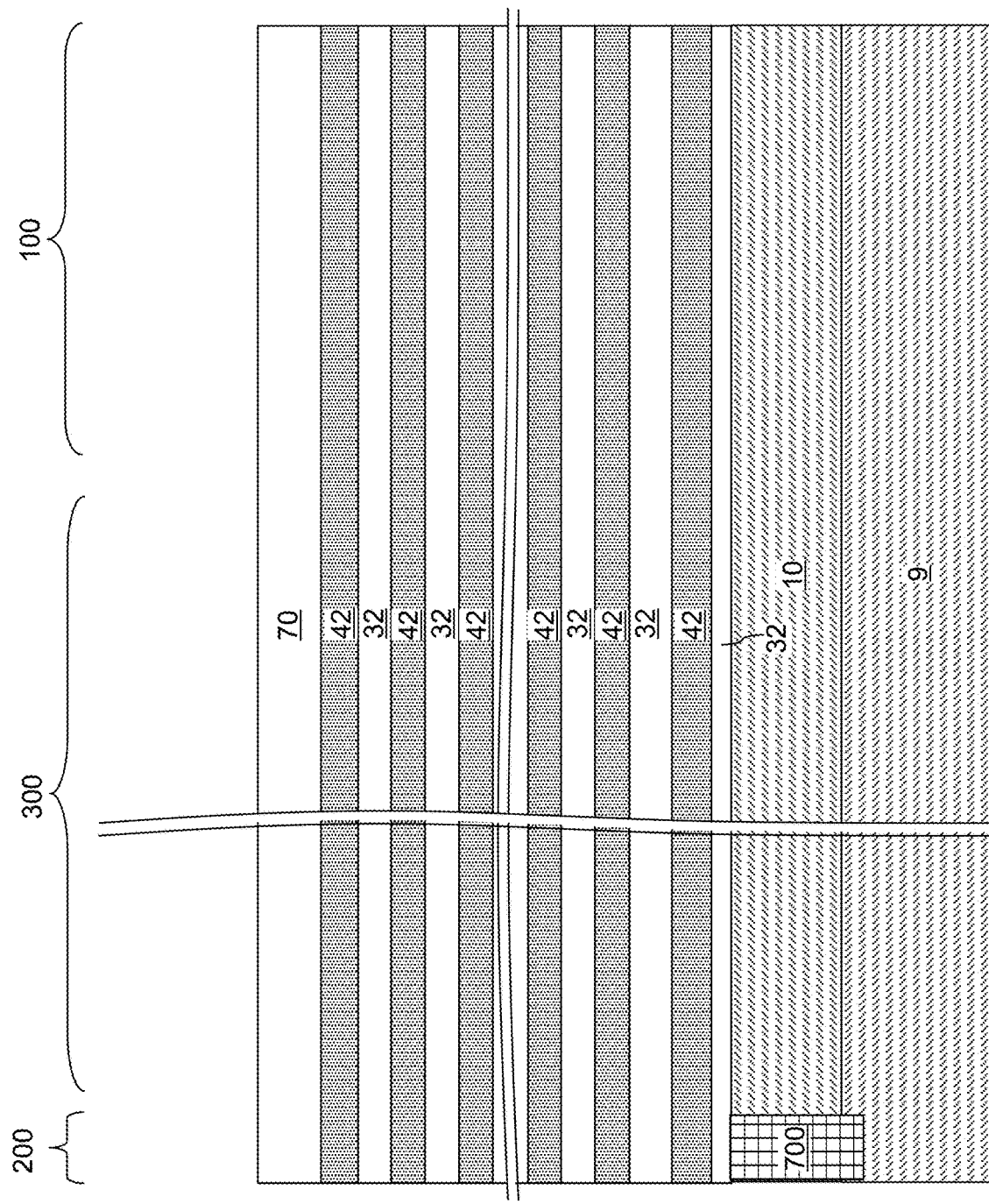
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be employed. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be employed for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
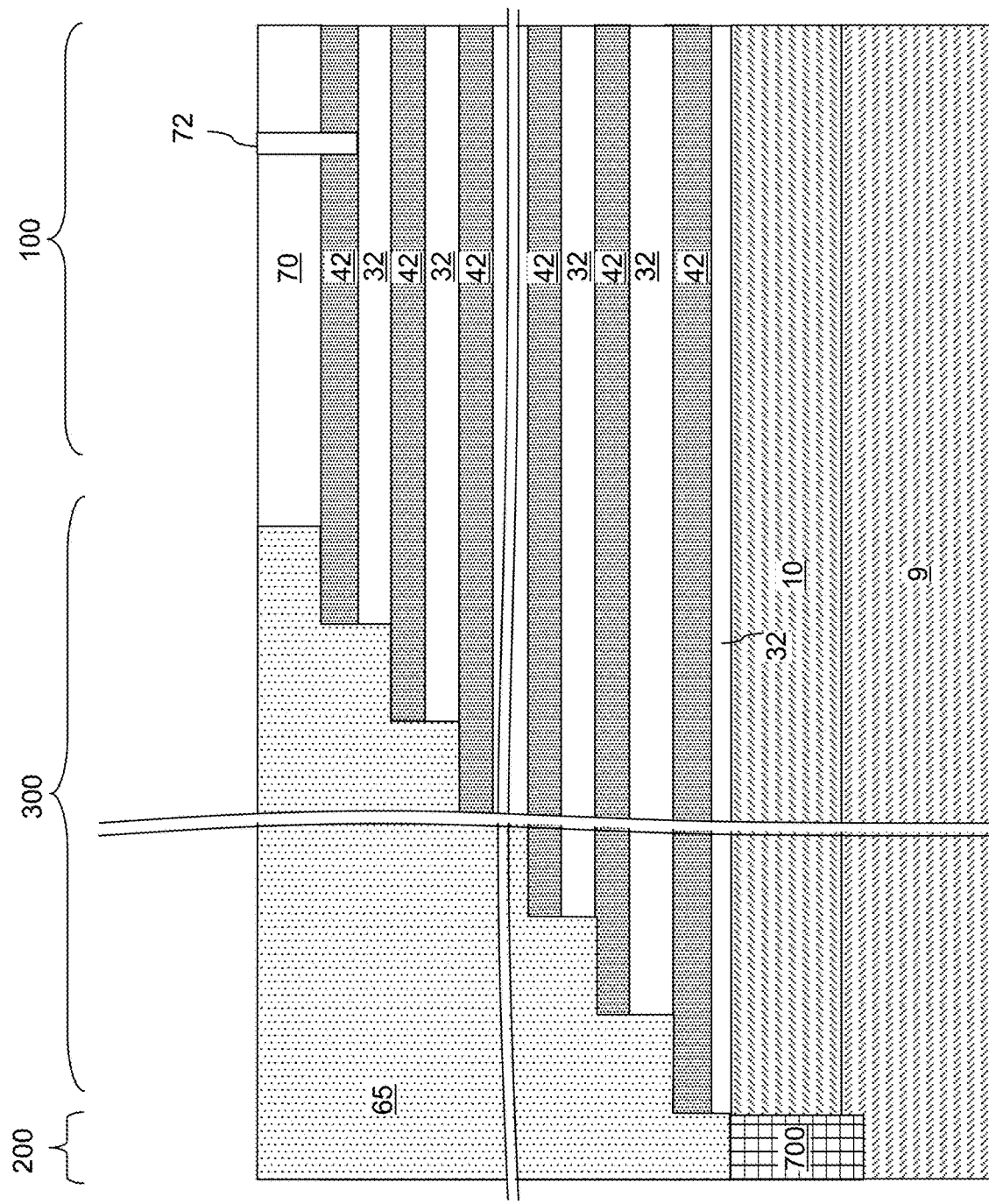
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
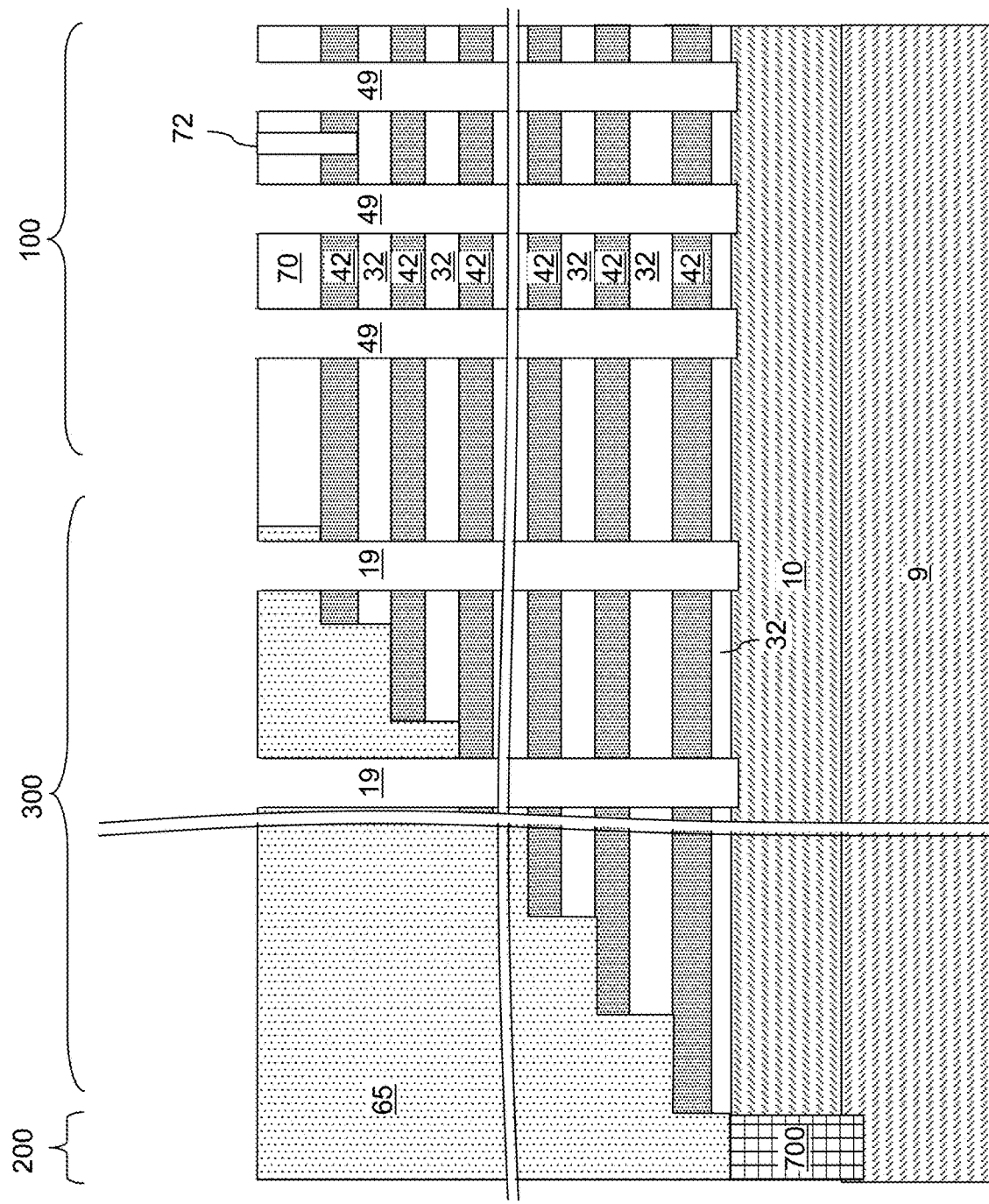
FIG. 4A is a schematic vertical cross-sectional view of the first exemplary structure after formation of memory openings and support openings according to the first embodiment of the present disclosure.
Figure 4B:
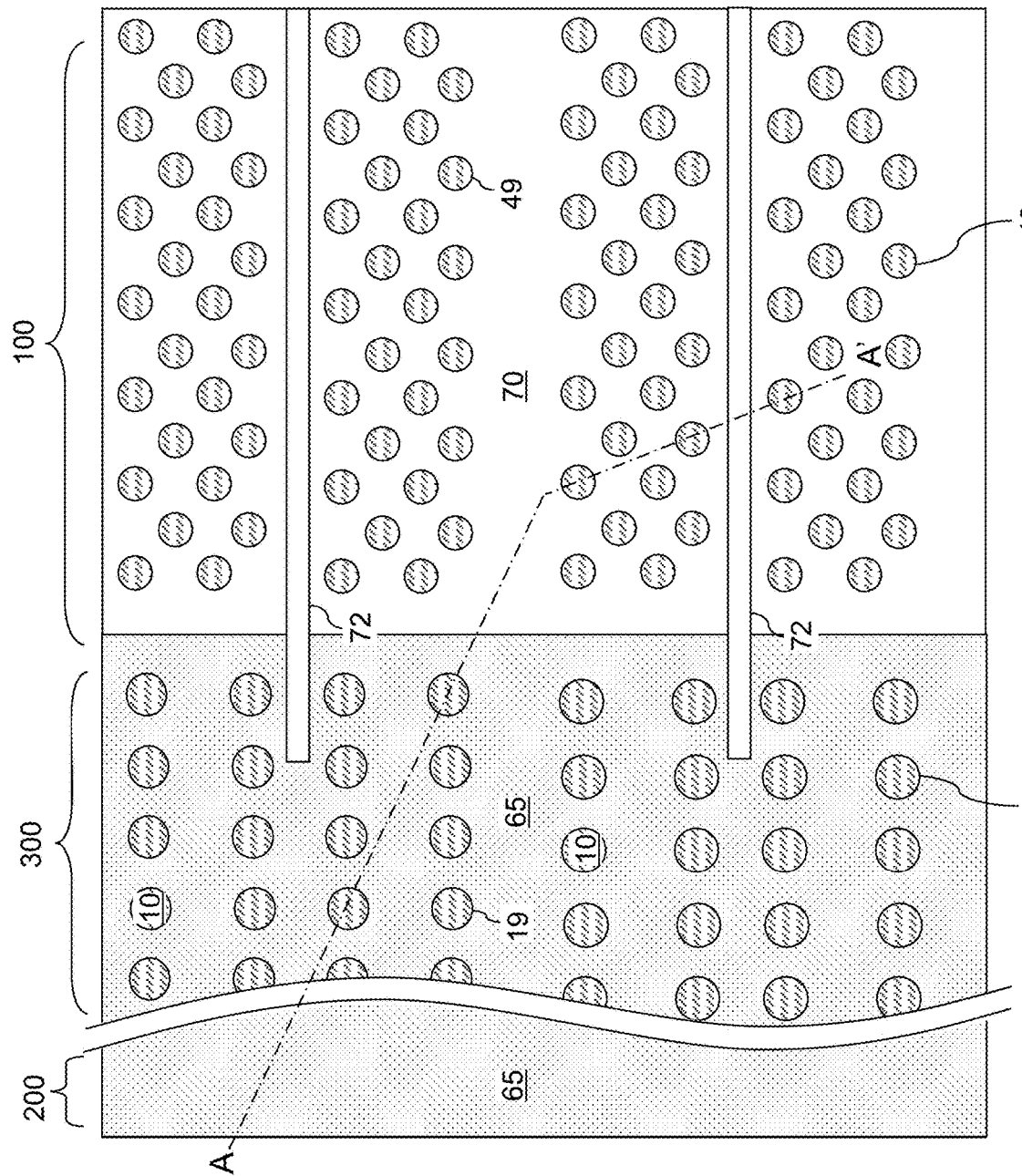
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, during, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes during formation of a memory opening fill structure in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be employed. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 5C:
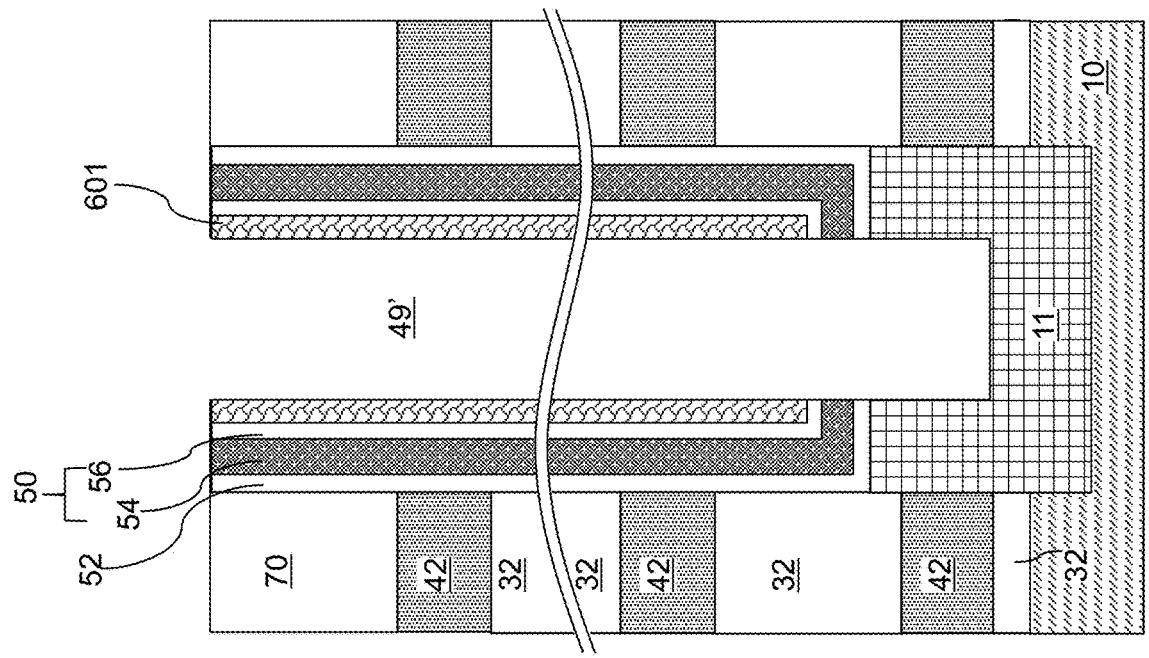

Referring to FIG. 5C, a stack of layers including a backside gate dielectric layer 52, a ferroelectric material layer 54, a front-side gate dielectric layer 56, and an optional first semiconductor channel layer 601 is formed. Alternatively, the optional first semiconductor channel layer 601 may be omitted. Specifically, the backside gate dielectric layer 52 includes a high dielectric constant (high-k) dielectric metal oxide material. As used herein, a high-k dielectric material refers to a dielectric material having a dielectric constant greater than the dielectric constant of thermal silicon nitride (which is 7.9). The high-k dielectric metal oxide material of the backside gate dielectric layer 52 may be selected such that the band gap of the high-k dielectric metal oxide material of the backside gate dielectric layer 52 is greater than the band gap of the ferroelectric material of the ferroelectric material layer 54. For example, if the ferroelectric material layer to be subsequently formed includes the ferroelectric non-centrosymmetric orthorhombic phase of doped or undoped hafnium oxide ($HfO_2$) (such as zirconium doped hafnium oxide, also known as hafnium zirconium oxide ($Hf_xZr_{1-x}O_2$)), the high-k dielectric material of the backside gate dielectric layer 52 may include aluminum oxide. $HfO_2$ and $Hf_xZr_{1-x}O_2$ have a band gap of about 6 eV and a dielectric constant of about 23. Aluminum oxide has a band gap of about 8.6 eV and a dielectric constant of about 10. Non-limiting examples of additional dielectric materials that have a greater band gap than $HfO_2$ and $Hf_xZr_{1-x}O_2$ and have a dielectric constant greater than 7.9 include $ZrSiO_4$ and $HfSiO_4$ (having a band gap of about 6.5 eV and a dielectric constant of about 11-13), $YAlO_3$ (having a band gap of about 7.7 eV and a dielectric constant of about 13), $MgO$ (having a band gap of about 7.6 eV and a dielectric constant of about 9), $CaO$ (having a band gap of about 7.7 eV and a dielectric constant of about 11) and $Sc_2O_3$ (having a band gap of about 6.5 eV and a dielectric constant of about 14). The backside gate dielectric layer 52 may be formed by a conformal deposition process such as an atomic layer deposition process or a low pressure chemical vapor deposition process. The thickness of the backside gate dielectric layer 52 may be in a range from 0.7 nm to 4 nm, such as from 1.2 nm to 2 nm, although lesser and greater thicknesses may also be employed. Each cylindrical portion of the backside gate dielectric layer 52 located at a level of the sacrificial material layer 42 constitutes a backside gate dielectric. Thus, the backside gate dielectric layer 52 includes a vertical stack of backside gate dielectrics.

The ferroelectric material layer 54 includes a ferroelectric material. As used herein, a "ferroelectric material" refers to a crystalline material that exhibits spontaneous electrical polarization in the absence of an external electric field. The ferroelectric material in the ferroelectric material layer 54 may be an insulating ferroelectric material. In one embodiment, the ferroelectric material layer 54 comprises the ferroelectric non-centrosymmetric orthorhombic phase of doped or undoped hafnium oxide layer. The doped hafnium oxide may include at least one dopant selected from Al, Zr, and Si. Other suitable ferroelectric materials may also be used, as such as titanate ferroelectric materials (e.g., barium titanate, lead titanate, lead zirconate titanate, lead lanthanum zirconate titanate ("PLZT"), etc.). In one embodiment, the ferroelectric material layer 54 may consist essentially of $Hf_xZr_{1-x}O_2$, in which x is in a range between 0 and 1, such as 0.05 to 0.6. The ferroelectric material layer 54 may have a thickness in a range from 4 nm to 24 nm, such as from 8 nm to 12 nm, although lesser and greater thicknesses may also be employed. In one embodiment, the ferroelectric material layer 54 may be deposited by a conformal deposition process such as chemical vapor deposition (CVD) or atomic layer deposition (ALD) directly on physically exposed surfaces of the backside gate dielectric layer 52.

The front-side gate dielectric layer 56 includes a high dielectric constant (high-k) dielectric metal oxide material. The high-k dielectric metal oxide material of the front-side gate dielectric layer 56 may be selected such that the band gap of the high-k dielectric metal oxide material of the front-side gate dielectric layer 56 is greater than the band gap of the ferroelectric material of the ferroelectric material layer 54. For example, if the ferroelectric material layer to be subsequently formed includes $HfO_2$ or $Hf_xZr_{1-x}O_2$, the high-k dielectric material of the front-side gate dielectric layer 56 may include aluminum oxide or any of the high-k dielectric material layers that may be employed for the backside gate dielectric layer 52. The front-side gate dielectric layer 56 may be formed by a conformal deposition process such as an atomic layer deposition process or a low pressure chemical vapor deposition process. The thickness of the front-side gate dielectric layer 56 may be in a range from 0.7 nm to 4 nm, such as from 1.2 nm to 2 nm, although lesser and greater thicknesses may also be employed. Each cylindrical portion of the front-side gate dielectric layer 56 located at a level of the sacrificial material layer 42 constitutes a front-side gate dielectric. Thus, the front-side gate dielectric layer 56 includes a vertical stack of front-side gate dielectrics. The materials of the front-side gate dielectric layer 56 and the backside gate dielectric layer 52 may be the same as or different from each other. In one embodiment, the material of the backside gate dielectric layer 52 and front-side gate dielectric layer 56 has greater band offsets (i.e., valence and conduction band offsets) than the band offsets of the ferroelectric material layer 54 to form type I (Straddling Gap type) heterojunctions between the ferroelectric material layer 54 and each of the gate dielectric layers (52, 56).

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be employed. A memory cavity 49' is formed in the volume of each memory opening 49 that is not filled with the deposited material layers (52, 54, 56, 601).

Figure 5D:
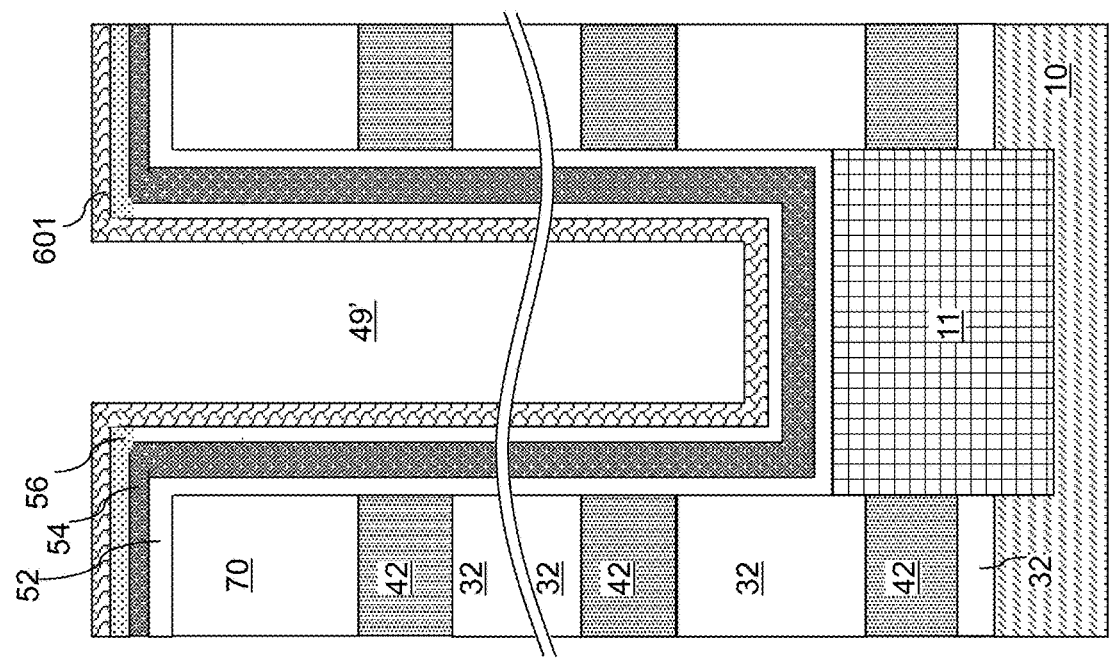

Referring to FIG. 5D, the optional first semiconductor channel layer 601, the front-side gate dielectric layer 56, the ferroelectric material layer 54, and the backside gate dielectric layer 52 are sequentially anisotropically etched employing at least one anisotropic etch process. The portions of the first semiconductor channel layer 601, the front-side gate dielectric layer 56, the ferroelectric material layer 54, and the backside gate dielectric layer 52 located above the top surface of the insulating cap layer 70 may be removed by the at least one anisotropic etch process. Further, the horizontal portions of the first semiconductor channel layer 601, the front-side gate dielectric layer 56, the ferroelectric material layer 54, and the backside gate dielectric layer 52 at a bottom of each memory cavity 49' may be removed to form openings in remaining portions thereof. Each of the first semiconductor channel layer 601, the front-side gate dielectric layer 56, the ferroelectric material layer 54, and the backside gate dielectric layer 52 may be etched by a respective anisotropic etch process employing a respective etch chemistry, which may, or may not, be the same for the various material layers. Each remaining portion of the first semiconductor channel layer 601 may have a tubular configuration.

A surface of the pedestal channel portion 11 (or a surface of the semiconductor material layer 10 in case the pedestal channel portions 11 are not employed) may be physically exposed underneath the opening through the first semiconductor channel layer 601, the front-side gate dielectric layer 56, the ferroelectric material layer 54, and the backside gate dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A front-side gate dielectric layer 56 is located over the ferroelectric material layer 54. A set of a ferroelectric material layer 54 and a front-side gate dielectric layer 56 in a memory opening 49 constitutes a memory film 50, which includes a plurality of ferroelectric material portions (which comprise the ferroelectric material layer 54) that are insulated from surrounding materials by the backside gate dielectric layer 52 and the front-side gate dielectric layer 56. In one embodiment, the first semiconductor channel layer 601, the front-side gate dielectric layer 56, the ferroelectric material layer 54, and the backside gate dielectric layer 52 may have vertically coincident sidewalls.

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. Alternatively, the dielectric core layer 62L may include a film of an inner silicon oxide layer and an outer aluminum oxide layer. The dielectric core layer 62L may be deposited by a conformal deposition method such as low pressure chemical vapor deposition (LPCVD), or by a self-planarizing deposition process such as spin coating.

Referring to FIG. 5G, the horizontal portion of the dielectric core layer 62L may be removed, for example, by a recess etch from above the top surface of the second semiconductor channel layer 602. Further, the material of the dielectric core layer 62L may be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5H, a doped semiconductor material having a doping of a second conductivity type may be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material may be in a range from $5.0 \times 10^{19}/cm^3$ to $2.0 \times 10^{21}/cm^3$, although lesser and greater dopant concentrations may also be employed. The doped semiconductor material may be, for example, doped polysilicon.

Excess portions of the deposited semiconductor material may be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 may be concurrently removed by a planarization process. Each remaining portion of the second semiconductor channel layer 602 may be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 (if present) and a second semiconductor channel layer 602 may collectively form a vertical semiconductor channel 60 through which electrical current may flow when a vertical NAND device including the vertical semiconductor channel 60 is turned on. A front-side gate dielectric layer 56 is surrounded by a ferroelectric material layer 54, and laterally surrounds a portion of the vertical semiconductor channel 60. Each adjoining set of a ferroelectric material layer 54 and a front-side gate dielectric layer 56 collectively constitute a memory film 50, which includes a vertical stack of cylindrical ferroelectric material portions that may store a respective data bit with a macroscopic retention time. As used herein, a macroscopic retention time refers to a retention time suitable for operation of a memory device as a permanent memory device such as a retention time in excess of 24 hours. In alternative embodiments, a backside gate dielectric layer 52 may not be formed in each memory opening, and may be subsequently formed in backside recesses that are formed by removal of the sacrificial material layers 42 at a subsequent processing step. The dielectric metal oxide material of the front-side gate dielectric layer 56 is herein referred to as a first dielectric metal oxide material, and the dielectric metal oxide material of the backside gate dielectric layer 52 is herein referred to as a second dielectric metal oxide material.

Each combination of a memory film 50 and a vertical semiconductor channel 60 within a memory opening 49 constitutes a memory stack structure 55. The memory stack structure 55 is a combination of a semiconductor channel 60, a front-side gate dielectric layer 56 including a vertical stack of front-side gate dielectrics, a plurality of memory elements which comprise portions of the ferroelectric material layer 54, and an optional backside gate dielectric layer 52 including a vertical stack of backside gate dielectrics. Each combination of a pedestal channel portion 11 (if present), a backside gate dielectric layer 52, a memory stack structure 55, a dielectric core 62, and a drain region 63 within a memory opening 49 is herein referred to as a memory opening fill structure 58. Each combination of a pedestal channel portion 11 (if present), a backside gate dielectric layer 52, a memory film 50, a vertical semiconductor channel 60, a dielectric core 62, and a drain region 63 within each support opening 19 fills the respective support openings 19, and constitutes a support pillar structure.

Figure 6:
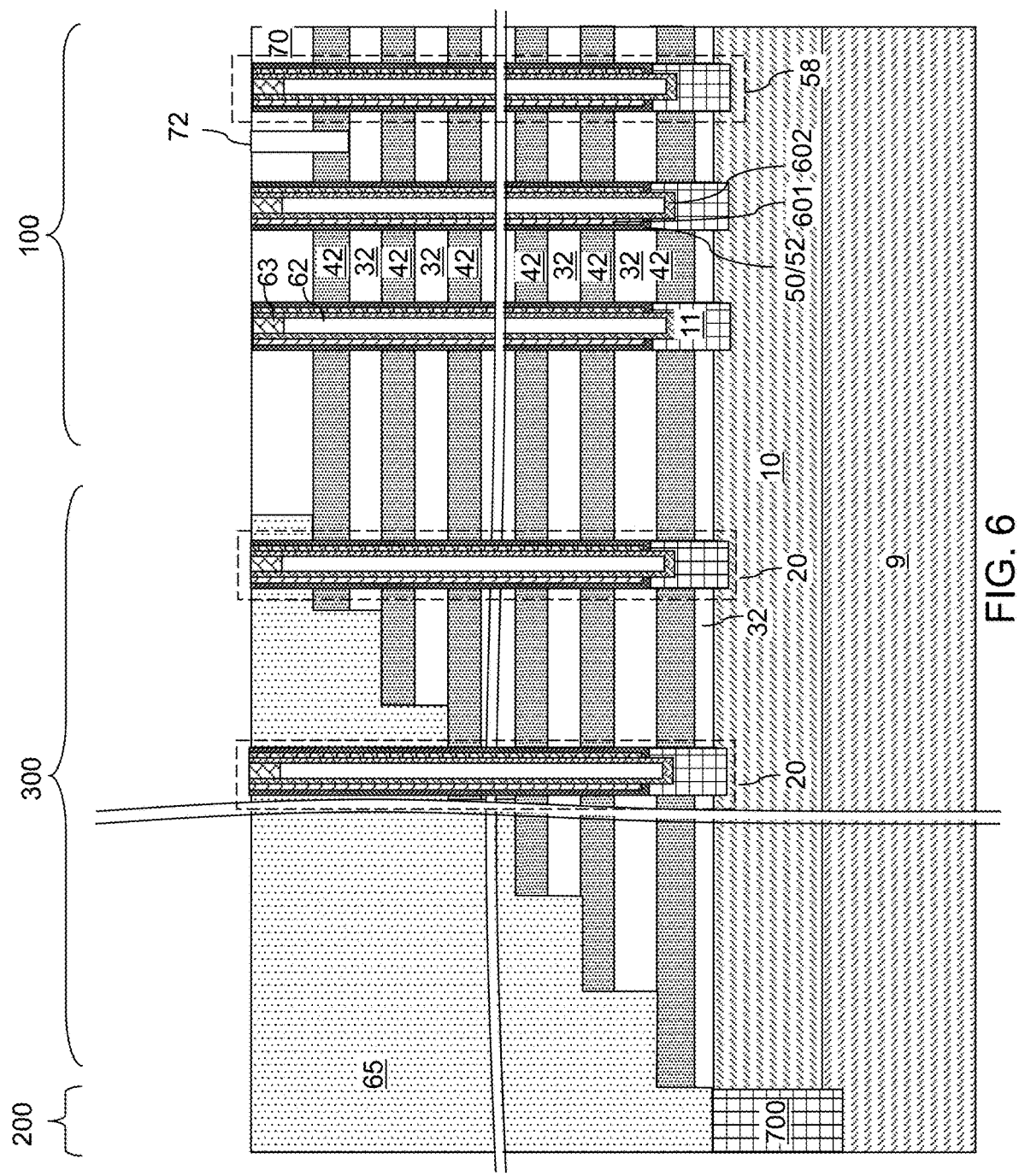
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, (which may comprise multiple semiconductor channel layers (601, 602) or a single semiconductor channel layer 602), and a memory film 50. The memory film 50 may comprise a front-side gate dielectric layer 56 laterally surrounding the vertical semiconductor channel 60, and a vertical stack of memory elements (which comprise portions of a ferroelectric material layer 54) laterally surrounding the front-side gate dielectric layer 56.

Figure 7A:
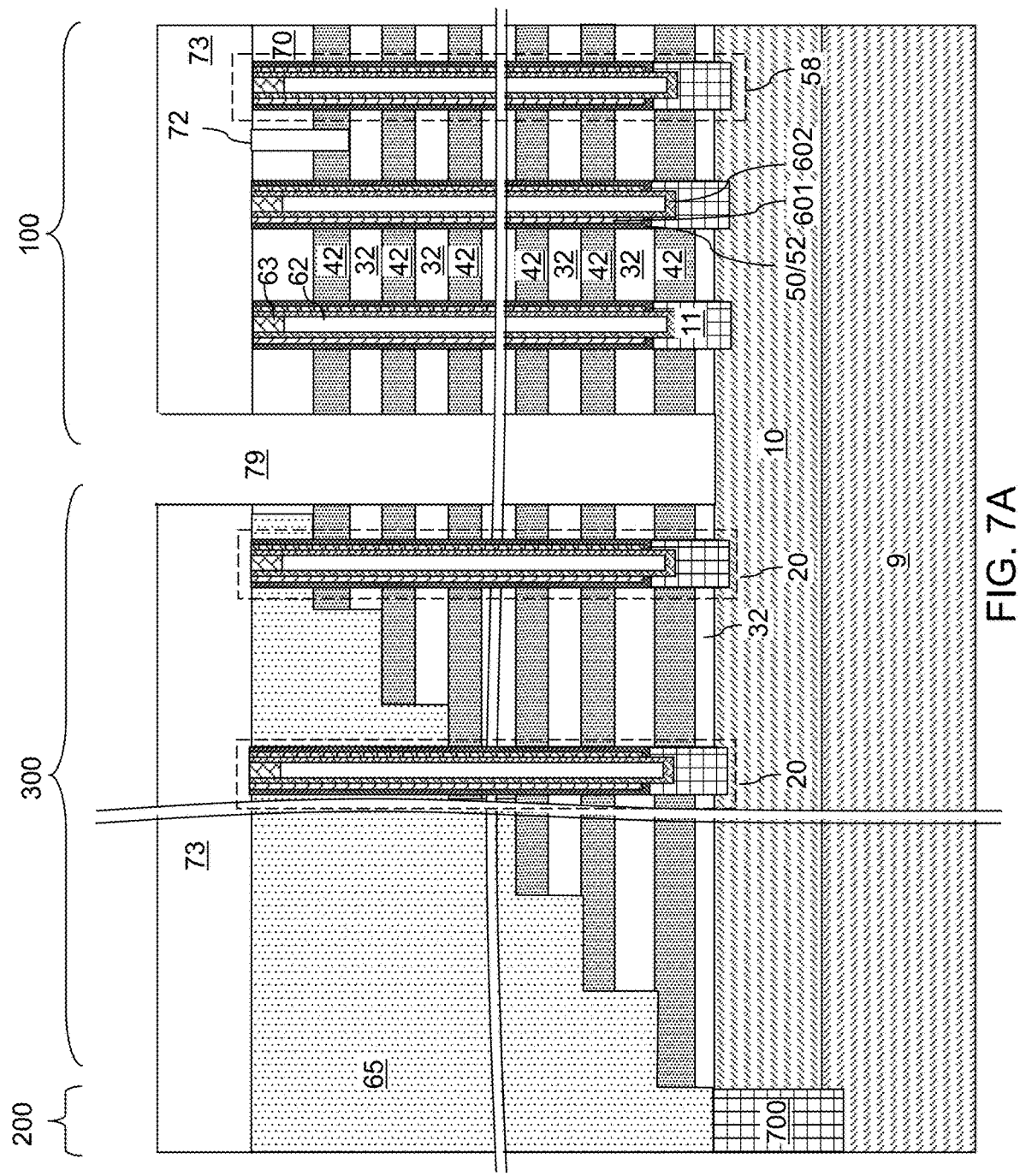
FIG. 7A is a schematic vertical cross-sectional view of the first exemplary structure after formation of backside trenches according to the first embodiment of the present disclosure.
Figure 7B:
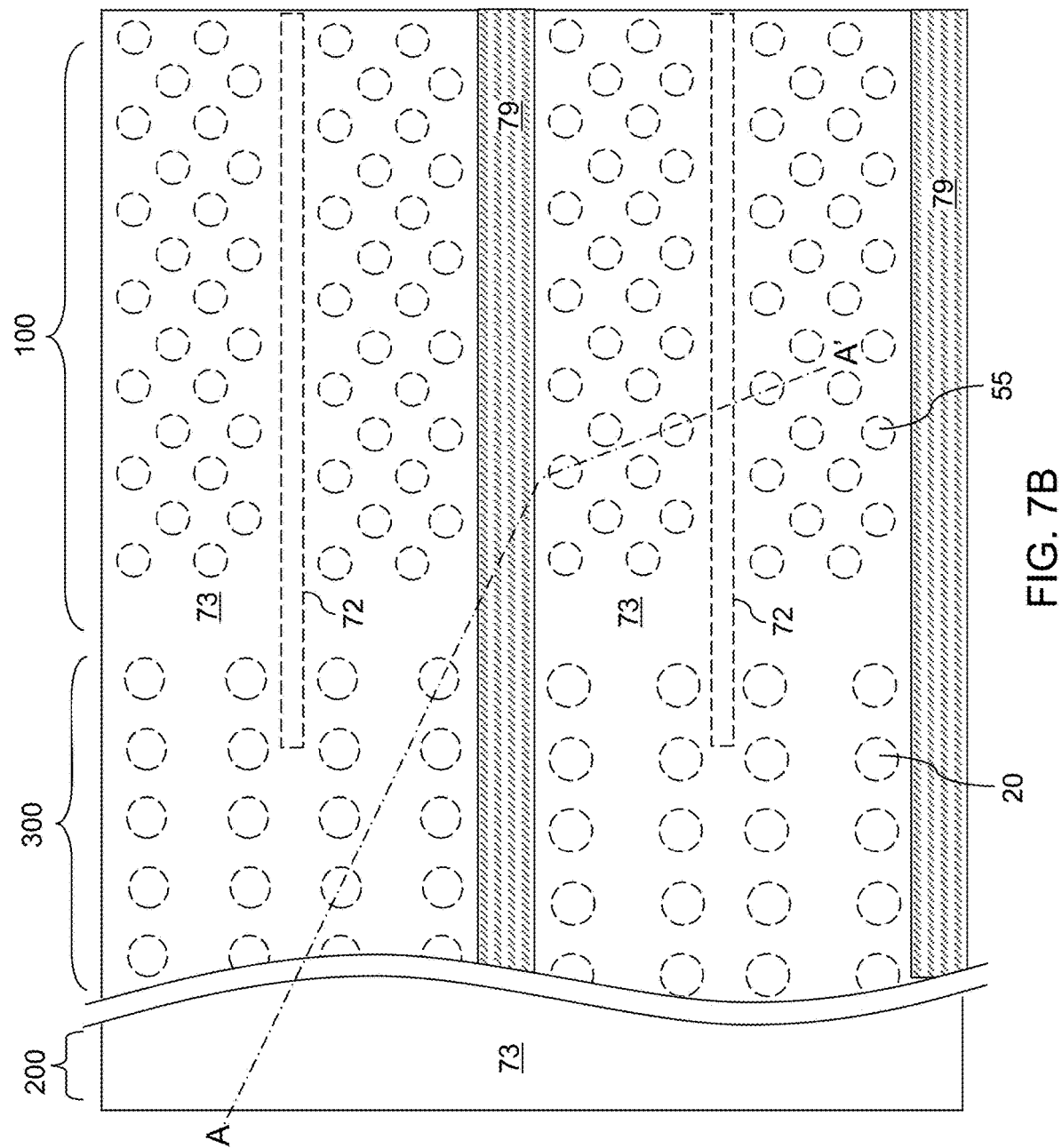
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be employed.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from each other along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
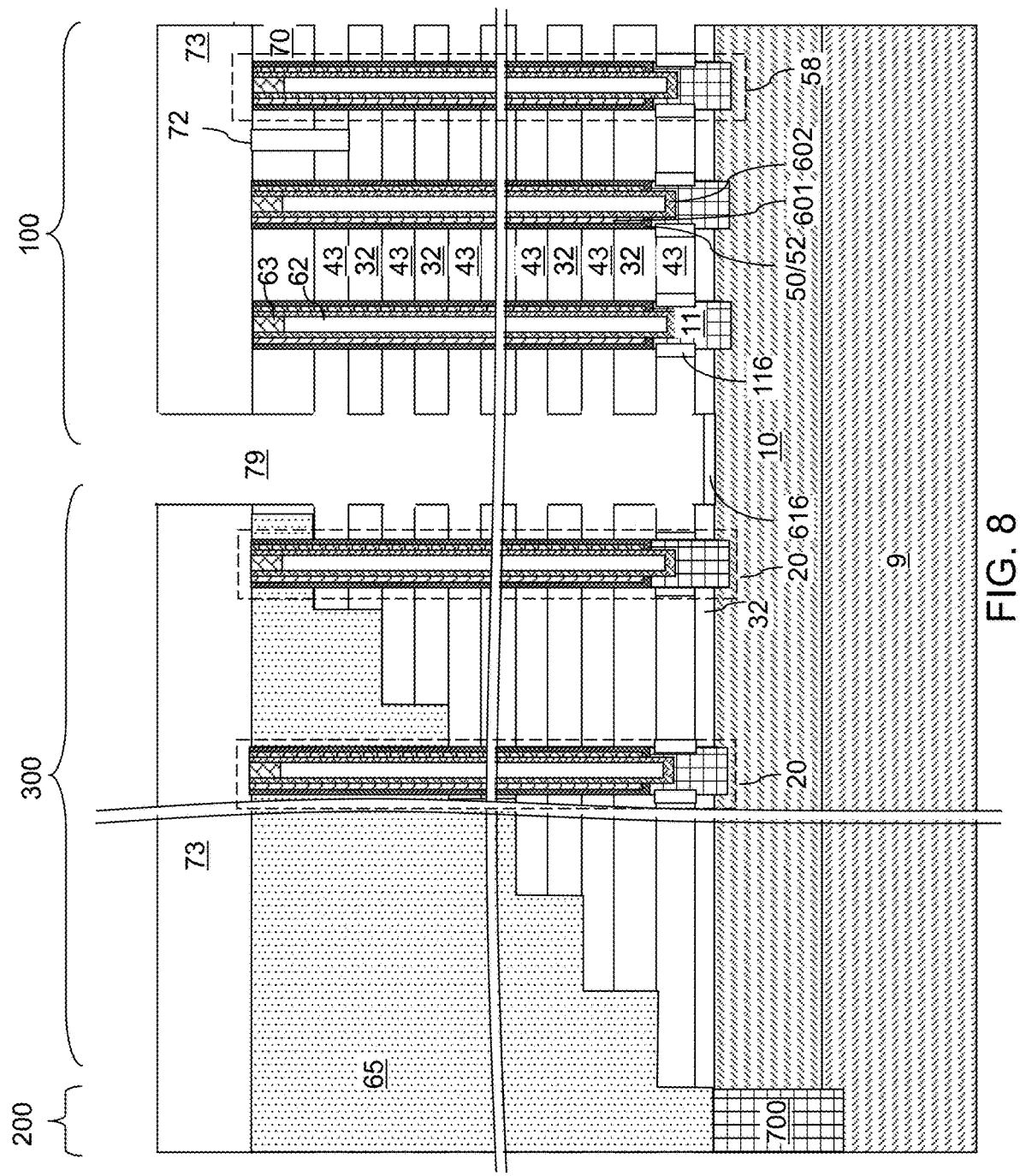
FIG. 8 is a schematic vertical cross-sectional view of the first exemplary structure after formation of backside recesses according to the first embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be employed. In one embodiment, the metallic barrier layer 46A may consist essentially of a conductive metal nitride such as TiN.

Figure 10:
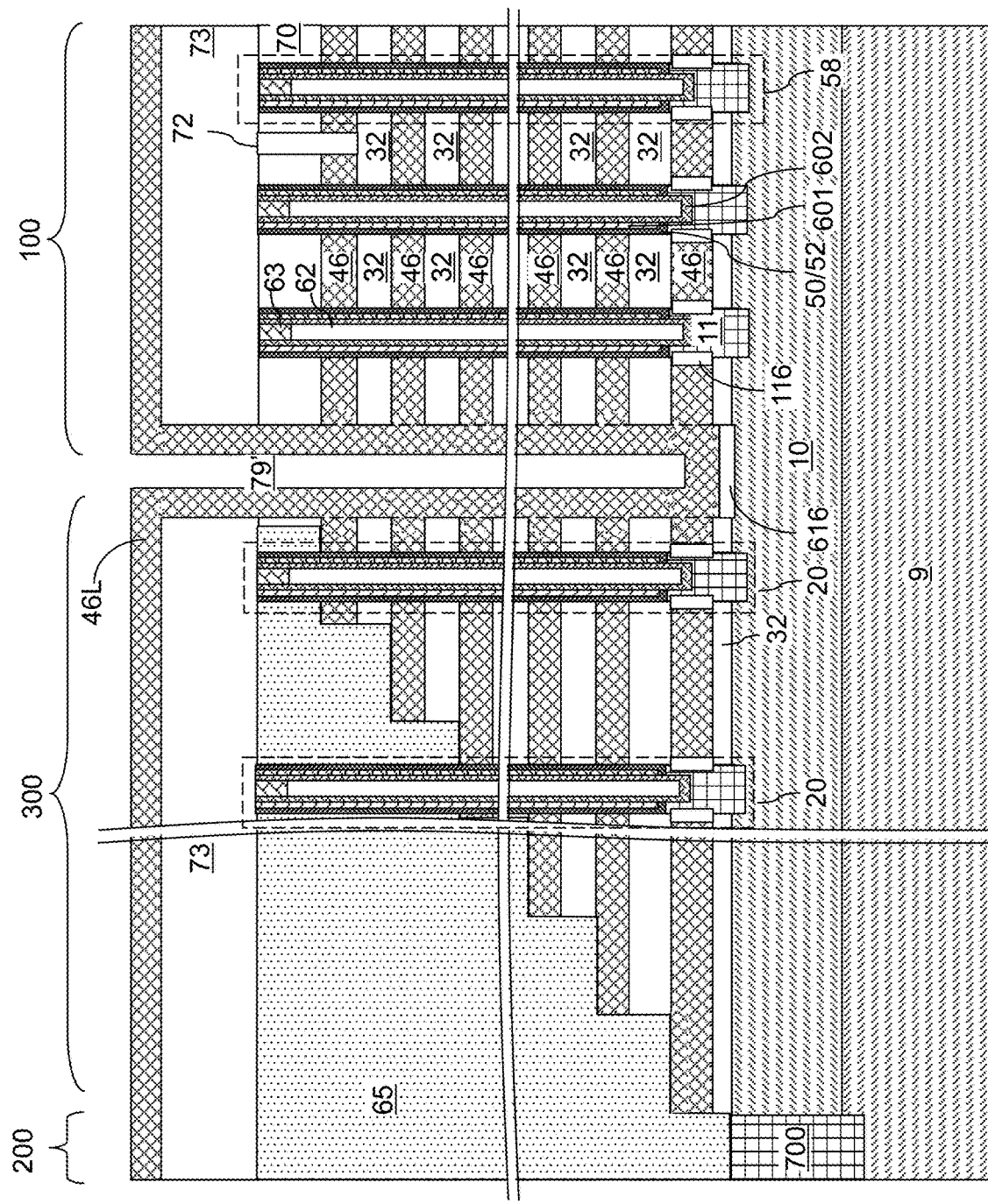
FIG. 10 is a schematic vertical cross-sectional view of the first exemplary structure at the processing step of FIG. 9C.

Referring to FIGS. 9C and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited employing a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Each electrically conductive layer 46 comprises a gate electrode 461 portion of a gate structure (561, 541, 521, 461). Each gate structure (561, 541, 521, 461) comprises a gate electrode 461 that is a cylindrical portion of an electrically conductive layer 46 that laterally surrounds a memory opening 49; a backside gate dielectric 521 that is a portion of a backside gate dielectric layer 52 located in the memory opening 49 and contacting, and laterally encircled by, the gate electrode 461; a ferroelectric material portion 541 that is a portion a ferroelectric material layer 54 and contacting, and laterally encircled by, the backside gate dielectric 521; and a front-side gate dielectric 561 that is a portion of the front-side gate dielectric layer 56 and contacting, and laterally encircled by, the ferroelectric material portion 541.

A vertical stack of backside gate dielectrics 521 is formed within each of the memory openings 49. Each vertical stack of backside gate dielectrics 521 comprises portions of a respective backside gate dielectric layer 52. Each ferroelectric material layer 54 is formed on a respective vertical stack of the backside gate dielectrics 521 that are contained within a backside gate dielectric layer 52.

Each gate structure (561, 541, 521, 461) includes material portions located between a respective first horizontal plane HP1 including a top surface of a respective gate electrode 461 and a respective second horizontal plane HP2 including a bottom surface of the respective gate electrode 461. The first exemplary structure includes a plurality of gate structures (561, 541, 521, 461) that are spaced apart from each other along the vertical direction. Each of the plurality of gate structures (561, 541, 521, 461) contacts a respective portion of the surface of the vertical semiconductor channel 60.

Figure 11:
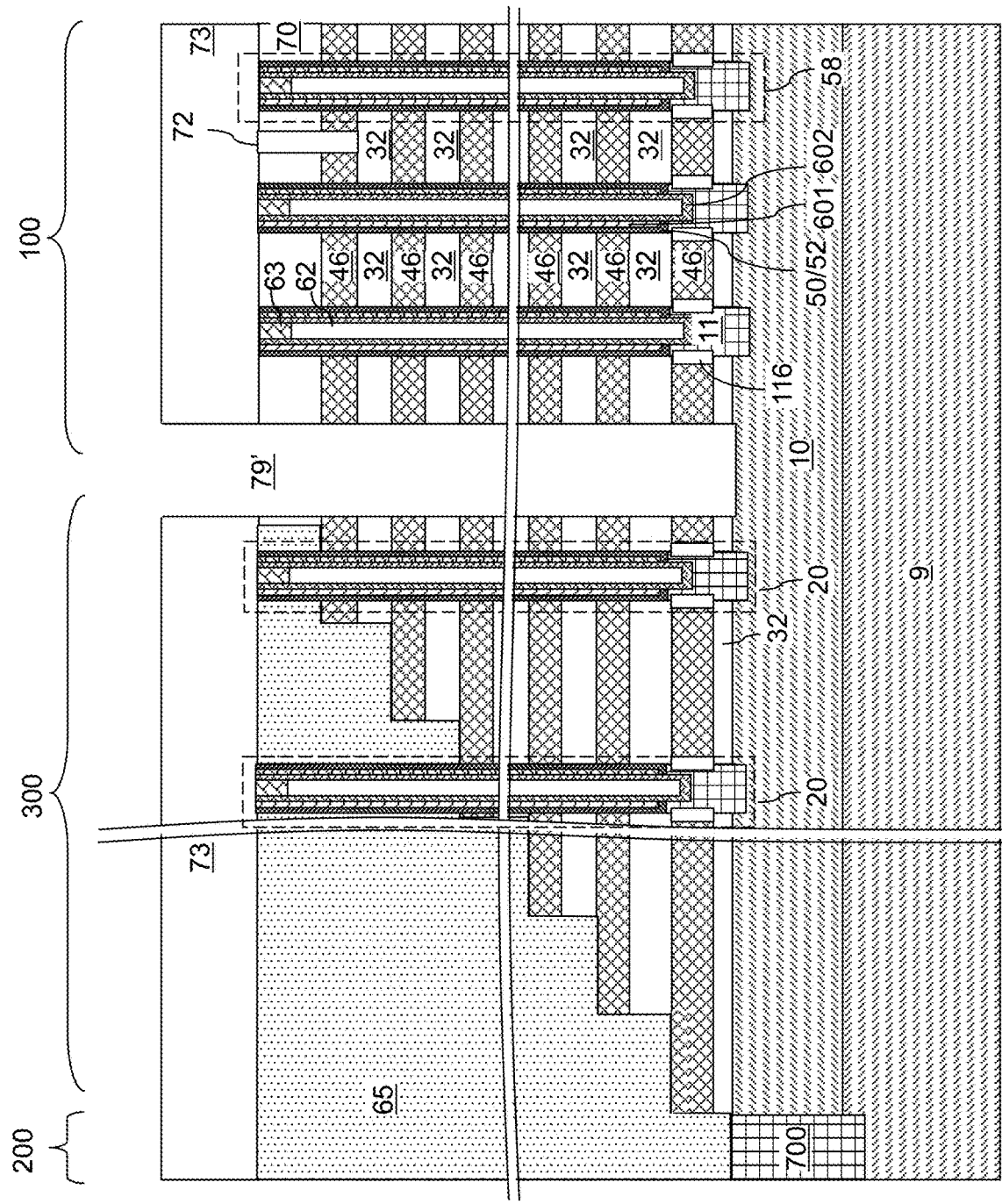
FIG. 11 is a schematic vertical cross-sectional view of the first exemplary structure after removal of a deposited conductive material from within the backside trench according to the first embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices. The planar dielectric portions 616 may be removed during removal of the continuous electrically conductive material layer 46L. A backside cavity 79' is present within each backside trench 79.

Figure 12:
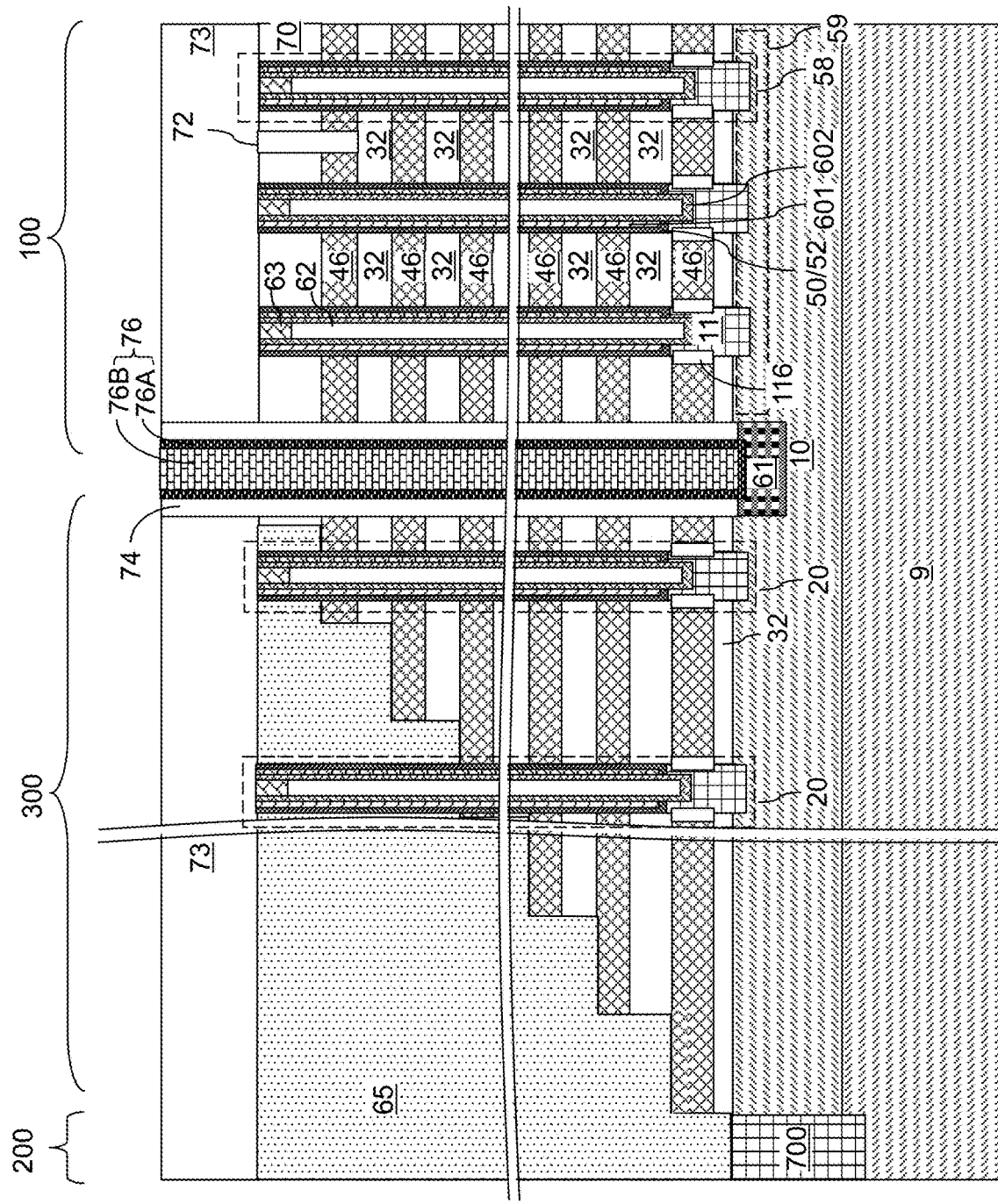
FIG. 12 is a schematic vertical cross-sectional view of the first exemplary structure after formation of an insulating spacer and a backside contact structure according to the first embodiment of the present disclosure.

Referring to FIG. 12, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be employed. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is employed, the contact level dielectric layer 73 may be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 13A:
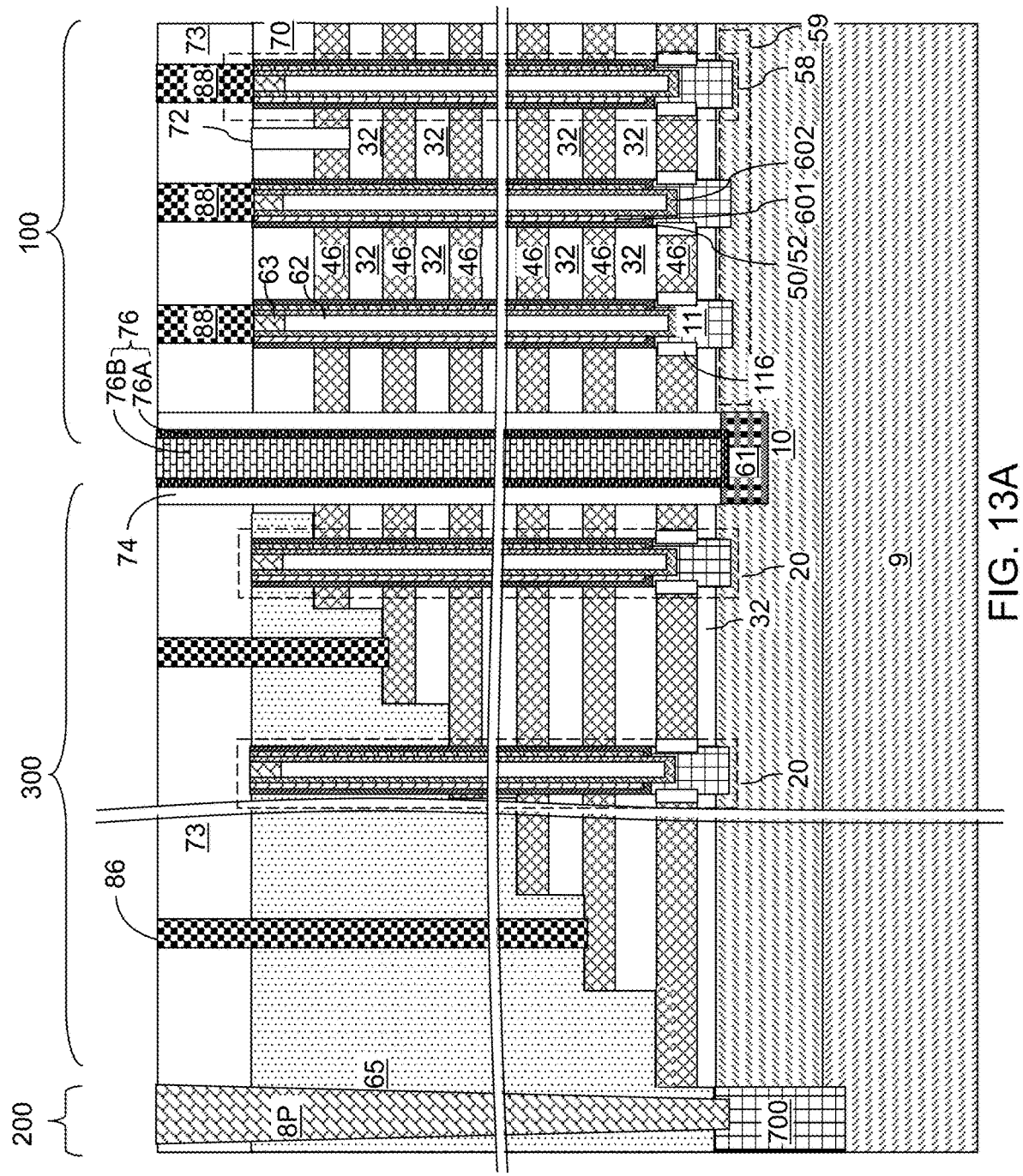
FIG. 13A is a schematic vertical cross-sectional view of the first exemplary structure after formation of additional contact via structures according to the first embodiment of the present disclosure.
Figure 13B:
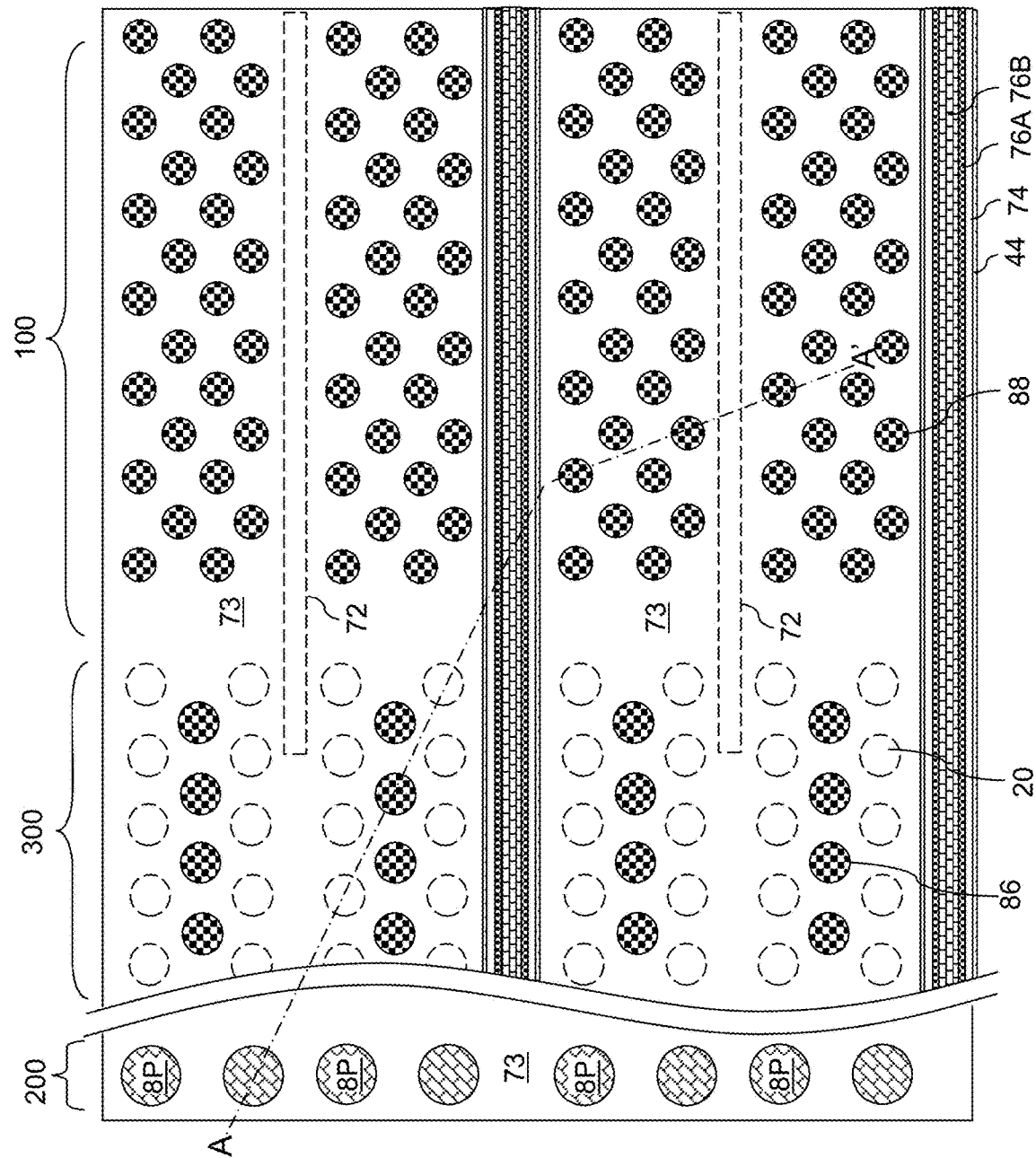
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices. In one alternative embodiment, the peripheral devices 700 are formed on a separate substrate and then bonded to the memory devices. In that case, the peripheral device contact via structures 8P may be omitted. In another alternative embodiment, the peripheral devices 700 may be formed underneath the alternating stack (32, 46). In that case, a horizontal source line may be provided in contact with a side of the vertical semiconductor channels 60 and the peripheral device contact via structures 8P may extend through the alternating stack (32, 46).

Referring to FIGS. 1-13B and according to various embodiments that forms the first exemplary structure, a semiconductor structure comprising one or more field effect transistors is provided. A field effect transistor is formed around each memory opening 49. Each of the field effect transistors includes a respective combination of a source region 61, a drain region 63, and a semiconductor channel (59, 11, 60) extending between the source region 61 and the drain region 63. A source region 61 may be shared among multiple field effect transistors. Each field effect transistor may include a respective set of gate structures (521, 541, 561, 461), of which structural details are illustrated in FIG. 9C. Components of the gate structures (521, 541, 561, 461) may be formed prior to, during, or after, formation of various components the semiconductor channel (59, 60, 61). Each gate structure (521, 541, 561, 461) of a field effect transistor contacts a surface of the semiconductor channel (59, 11, 60) of the field effect transistor. Generally, each gate structure (521, 541, 561, 461) may be formed by: forming a stack including, from one side to another, a front-side gate dielectric 521, a ferroelectric material portion 541, and a backside gate dielectric 561 such that the front-side gate dielectric 521 comprises a first dielectric metal oxide material, the backside gate dielectric 561 comprises a second dielectric metal oxide material, and the front-side gate dielectric 561 contacts a surface of the semiconductor channel (59, 11, 60). A gate electrode 461 may be formed on each backside gate dielectric 561.

In the first embodiment, an alternating stack of insulating layers 32 and sacrificial material layers 42 over a substrate (9, 10) may be formed, and a plurality of memory openings 49 may be formed through the alternating stack (32, 42). A plurality of vertical field effect transistors may be formed such that each semiconductor channel (59, 11, 60) of the plurality of vertical field effect transistors comprises a respective vertically-extending portion (i.e., vertical semiconductor channel) 60 that is formed in a respective one of the memory openings 49. Each of the front-side gate dielectrics 561 comprises a portion of a respective front-side gate dielectric layer 56 laterally surrounding, and contacting, a respective vertically-extending portion 60 of one of the semiconductor channels (59, 11, 60). Each of the ferroelectric material portions 541 comprises a portion of a respective ferroelectric material layer 54 laterally surrounding, and contacting, a respective one of the front-side gate dielectric layers 56. Each of the backside gate dielectrics 521 comprises a portion of a respective backside gate dielectric layer 52 laterally surrounding, and contacting, a respective one of the ferroelectric material layers 54. The sacrificial material layers 42 are replaced with comprising electrically conductive layers 46. Each gate electrode 461 of the plurality of vertical field effect transistors comprises a respective portion of a respective one of the electrically conductive layers 46.

The first exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (which comprises a portion of a ferroelectric material layer 54 at a level of an electrically conductive layer 46) in a first device level of the array of monolithic three-dimensional NAND strings may be located over another memory cell (which comprises another portion of the ferroelectric layer 54 at a level of another electrically conductive layer 46) in a second device level of the array of monolithic three-dimensional NAND strings. The silicon substrate may contain an integrated circuit comprising a driver circuit (which comprises a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of memory elements (which comprise portions of the ferroelectric material 54). Each memory element may be located adjacent to a respective one of the plurality of semiconductor channels (59, 11, 60).

FIGS. 14A-14F are sequential schematic vertical cross-sectional views of a memory opening within a second exemplary structure during formation of a memory stack structure 55, an optional dielectric core 62, and a drain region 63 therein according to a second embodiment of the present disclosure.

Referring to FIG. 14A, the second exemplary structure may be derived from the first exemplary structure at the processing step of FIG. 5C by omitting formation of the backside gate dielectric layer 52. Thus, the ferroelectric material layer 54 is deposited directly on the sidewall of each memory opening 49 and on a top surface of each pedestal channel portion 11.

Referring to FIG. 14B, the processing steps of FIG. 5D may be performed to remove horizontal portions of the optional first semiconductor channel layer 601, the front-side gate dielectric layer 56, and the ferroelectric material layer 54. The combination of remaining portions of the front-side gate dielectric layer 56 and the ferroelectric material layer 54 constitutes a memory film 50.

Referring to FIG. 14C, a second semiconductor channel layer 602 may be formed by performing the processing steps of FIG. 5E.

Referring to FIG. 14D, a dielectric core material layer 62L may be formed by performing the processing steps of FIG. 5F.

Figure 14F:
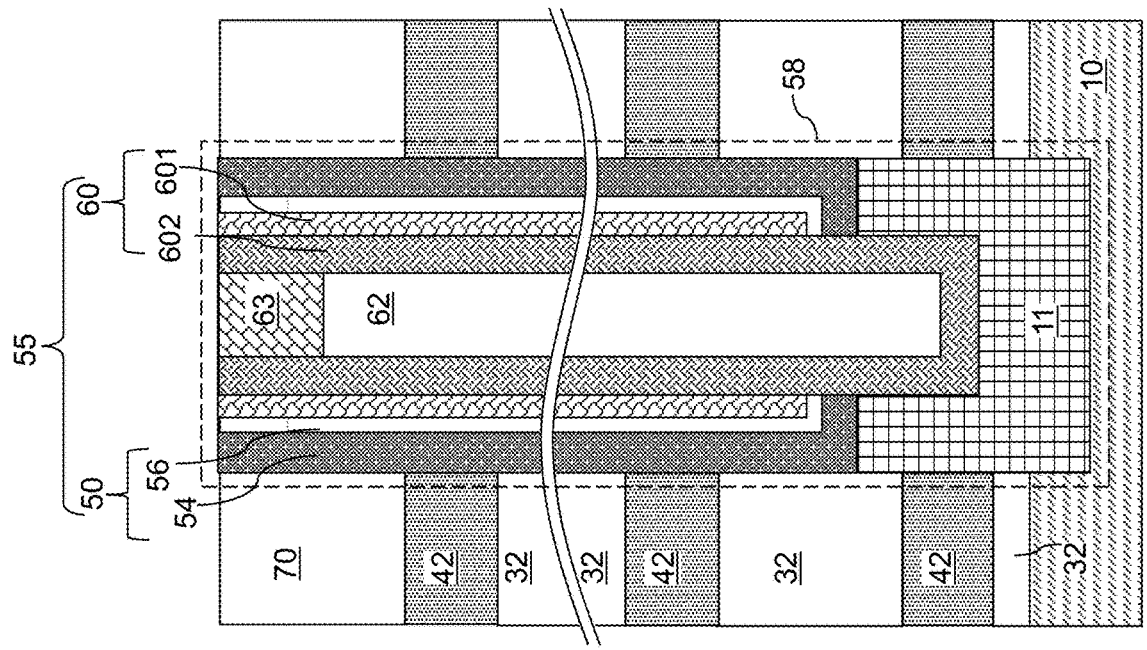
Figure 14E:
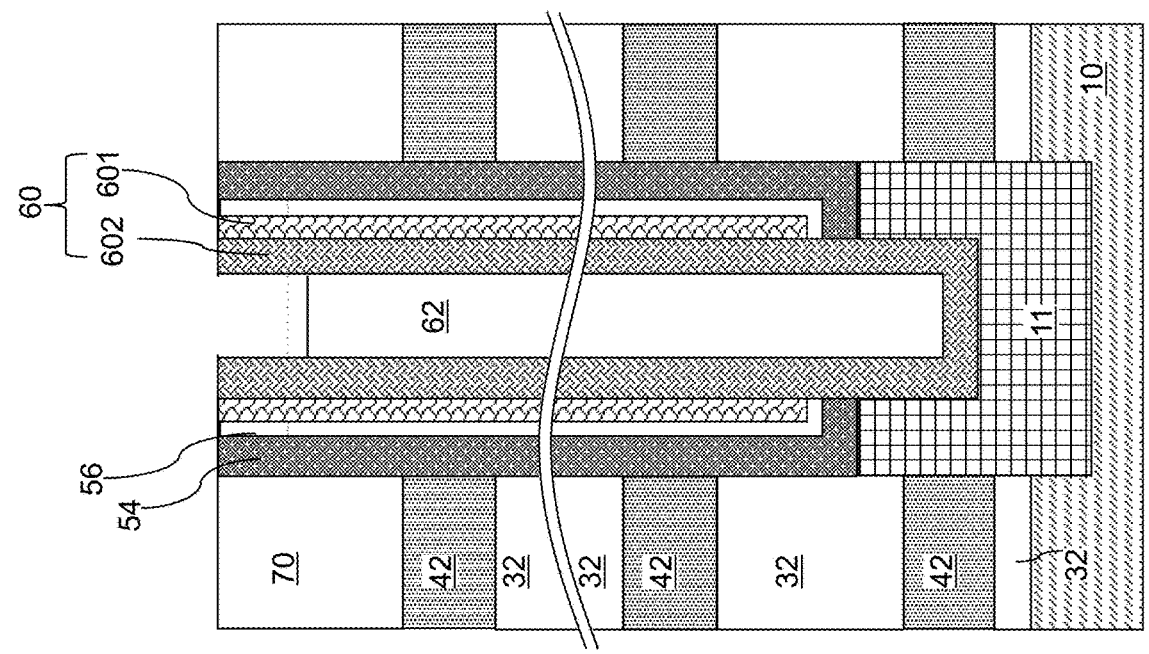

Referring to FIG. 14E, a dielectric core 62 may be formed within each memory opening 49 by performing the processing steps of FIG. 5G, i.e., by vertically recessing the dielectric core material layer 62L.

Referring to FIG. 14F, a drain region 63 is formed within each recess region that overlies the drain regions 63. A memory opening fill structure 58 is formed within each memory opening 49, and a support pillar structure is formed within each support opening. Each memory opening fill structure 58 in the second exemplary structure includes a front-side gate dielectric layer 56, a ferroelectric material portion 54, a vertical semiconductor channel 60, an optional pedestal channel structure 11, an optional dielectric core 62, and a drain region 63, and does not include the backside gate dielectric layer 52 of the first embodiment.

Subsequently, the processing steps of FIGS. 7A, 7B, 8, and 9A may be performed to form backside trenches 79, backside recesses 43, tubular dielectric spacers 116, and planar dielectric portions 616.

FIGS. 15A-15D are sequential vertical cross-sectional views of a region of the second exemplary structure during formation of electrically conductive layers 46 according to the second embodiment of the present disclosure.

Referring to FIG. 15A, backside recesses 43 are formed by removing the sacrificial material layers 42 selective to the materials of the insulating layers 32 and the ferroelectric material layers 54. Cylindrical portions of outer sidewalls of the ferroelectric material layers 54 are physically exposed to the backside recesses 43.

Referring to FIG. 15B, a backside gate dielectric layer 152 may be formed by conformal deposition of a second dielectric metal oxide material, which may be any dielectric material oxide material (such as aluminum oxide) that may be used for the backside gate dielectric layer 52 of the first embodiment. The backside gate dielectric layer 152 may be formed by a conformal deposition process such as an atomic layer deposition process or a low pressure chemical vapor deposition process. The thickness of the backside gate dielectric layer 152 may be in a range from 1 nm to 10 nm, such as from 2 nm to 5 nm, although lesser and greater thicknesses may also be employed. Each portion of the backside gate dielectric layer 152 located within a backside recess 43 constitutes a backside gate dielectric, such that the backside gate dielectric is formed in each backside recess 43. Thus, the backside gate dielectric layer 152 includes a vertical stack of backside gate dielectrics. Each backside gate dielectric may contact a cylindrical portion of an outer sidewall of a respective one of the ferroelectric material layers 54. The backside gate dielectric layer 152 may be formed as a single continuous conformal material layer that extends into each of the backside trenches 79 and into each of the backside recesses 43. Each of the backside gate dielectrics comprises a portion of the backside gate dielectric layer 152, and each of the electrically conductive layers 46 is formed on a respective one of the backside gate dielectrics.

Referring to FIG. 15C, the processing steps of FIG. 9B may be performed to deposit a metallic barrier layer 46A on the physically exposed surfaces of the backside gate dielectric layer 152. The material composition and the thickness of the metallic barrier layer 46A may be the same as in the first embodiment.

Figure 16:
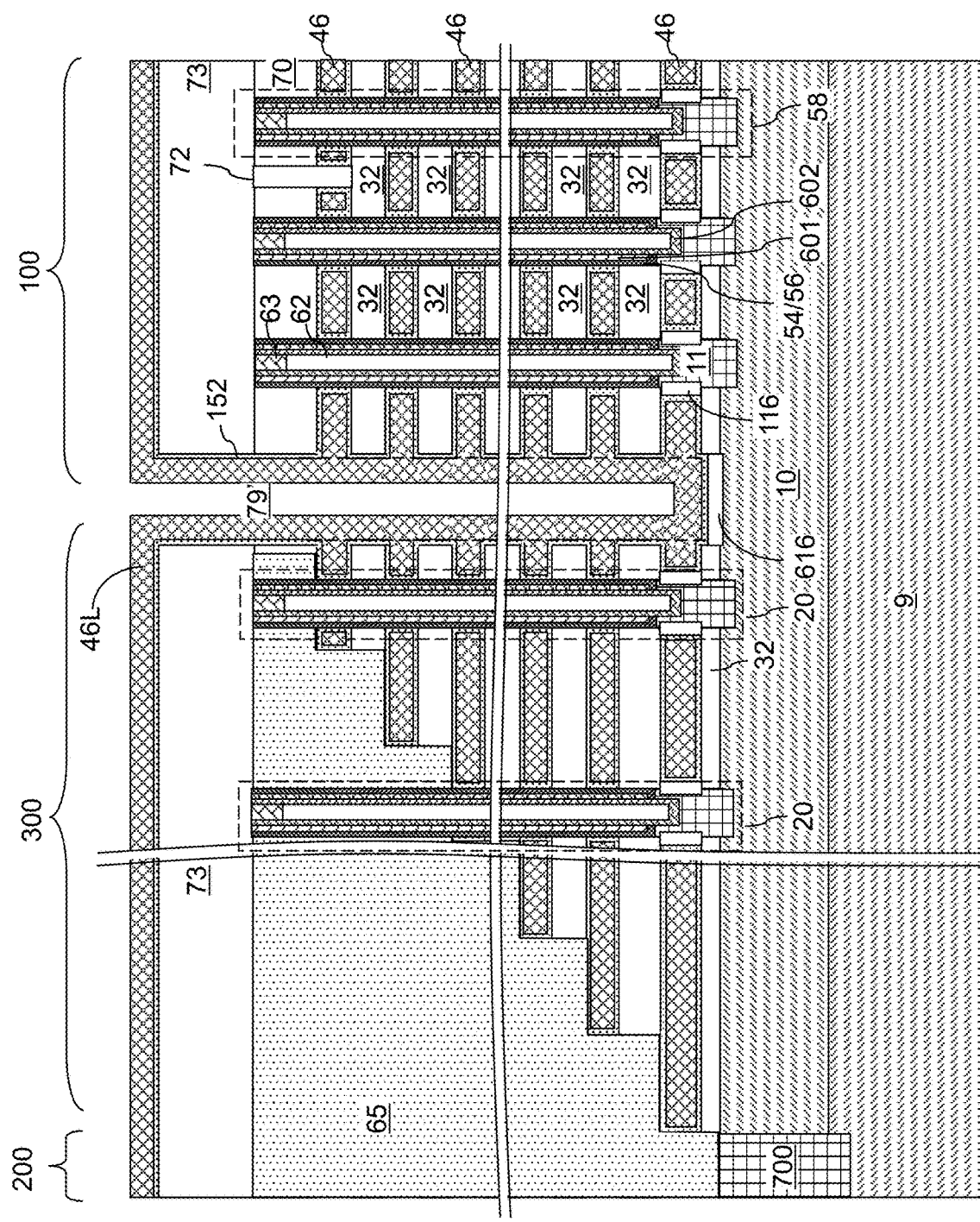
FIG. 16 is a schematic vertical cross-sectional view of the second exemplary structure at the processing step of FIG. 15D.

Referring to FIGS. 15D and 16, a metallic fill material layer 46B may be deposited on the metallic barrier layer by performing the processing steps of FIGS. 9C and 10.

Figure 17:
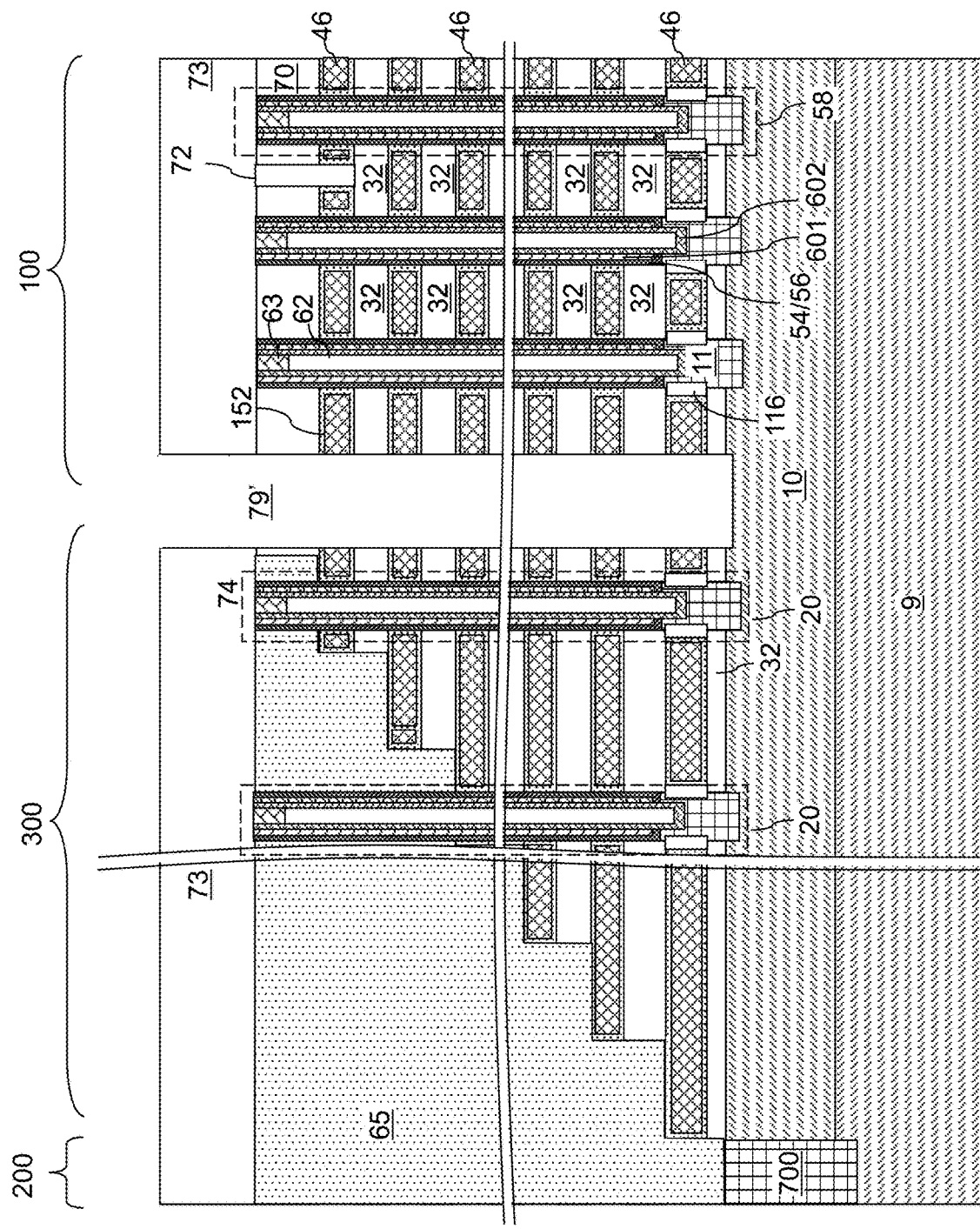
FIG. 17 is a schematic vertical cross-sectional view of the second exemplary structure after removal of a deposited conductive material from within the backside trench according to the second embodiment of the present disclosure.

Referring to FIG. 17, the processing steps of FIG. 11 may be performed to etch back the deposited metallic material of the continuous electrically conductive material layer 46L from the sidewalls of each backside trench 79 and from above the contact level dielectric layer 73. Remaining portions of the metallic barrier layer 46A and the metallic fill material layer 46B constitute electrically conductive layers 46. Vertical portions of the backside gate dielectric layer 152 in the backside trenches 79 may, or may not, be removed during removal of the portions of the metallic barrier layer 46A and the metallic fill material layer 46B in the backside trenches 79.

Figure 18A:
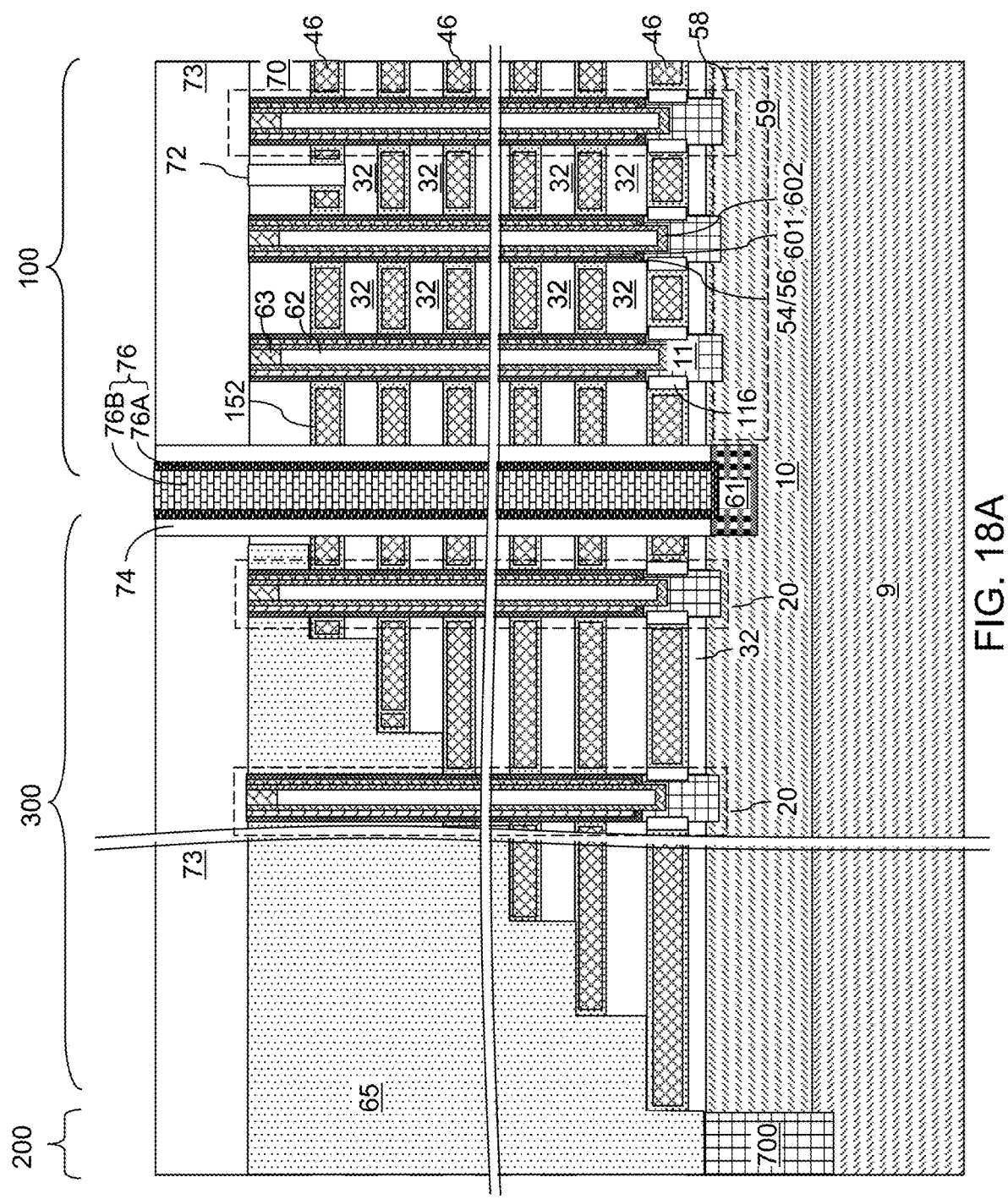
FIG. 18A is a schematic vertical cross-sectional view of the second exemplary structure after formation of an insulating spacer and a backside contact structure according to the second embodiment of the present disclosure.

Referring to FIGS. 18A and 18B, the processing steps of FIG. 12 may be performed to form source regions 61, horizontal semiconductor channels 59, insulating spacers 74, and backside contact via structures 76.

Figure 19:
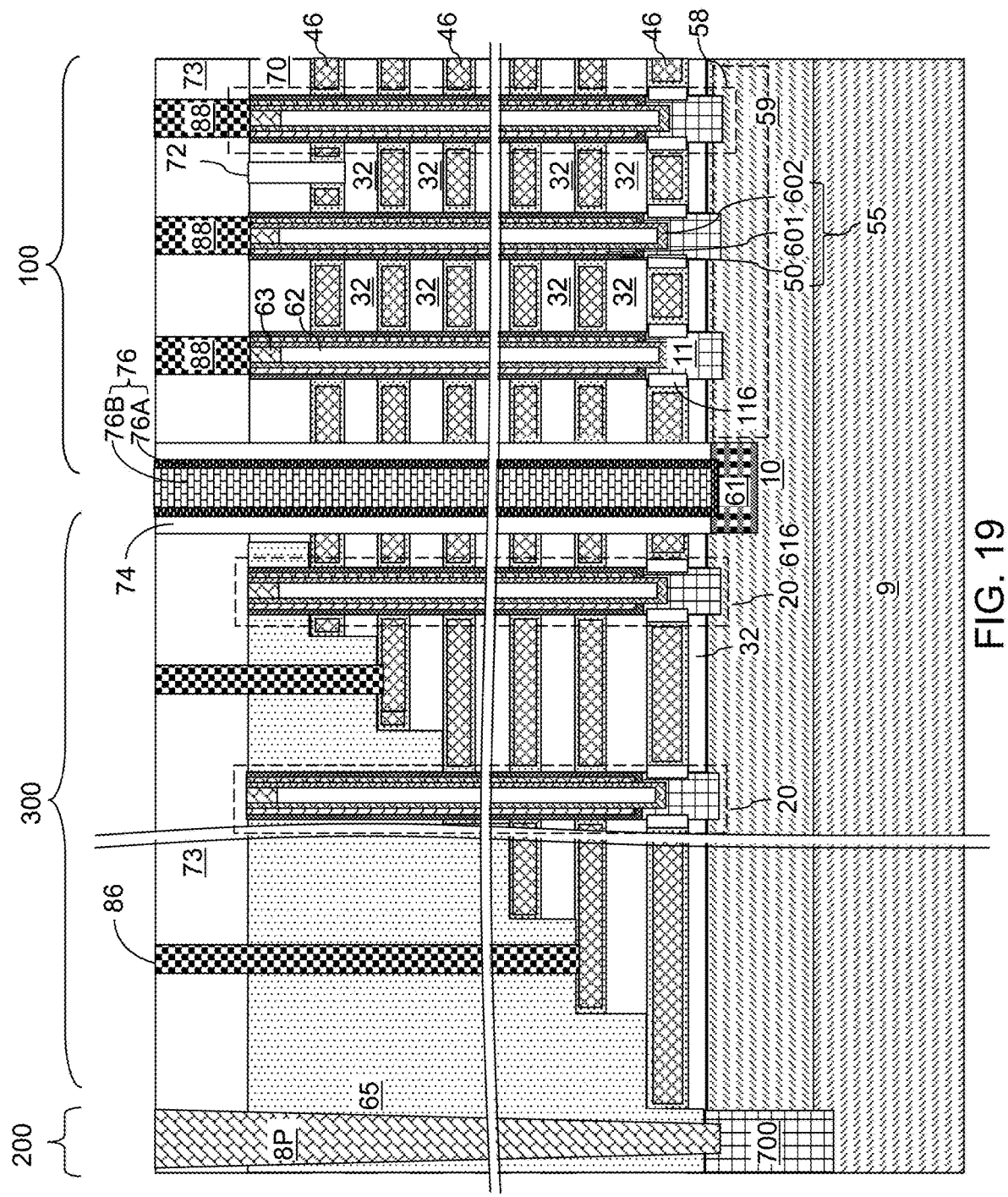
FIG. 19 is a schematic vertical cross-sectional view of the second exemplary structure after formation of additional contact via structures according to the second embodiment of the present disclosure.

Referring to FIG. 19, the processing steps of FIGS. 13A and 13B may be performed to form additional contact via structures (88, 86, 8P).

In the second exemplary structure, each electrically conductive layer 46 comprises a gate electrode 461 of a gate structure (561, 541, 152, 461). Each gate structure (561, 541, 152, 461) comprises a gate electrode 461 that is a cylindrical portion of an electrically conductive layer 46 that laterally surrounds a memory opening 49; a backside gate dielectric (which is a portion of a backside gate dielectric layer 152) that is located within a respective backside recess 43 and contacting, and laterally encircled by, the gate electrode 461; a ferroelectric material portion 541 that is a portion a ferroelectric material layer 54 and contacting, and laterally encircled by, the backside gate dielectric; and a front-side gate dielectric 561 that is a portion of the front-side gate dielectric layer 52 and contacting, and laterally encircled by, the ferroelectric material portion 541. As shown in FIG. 18B, each gate structure (561, 541, 152, 461) includes material portions located between a respective first horizontal plane HP1 including a top surface of a respective gate electrode 461 and a respective second horizontal plane HP2 including a bottom surface of the respective gate electrode 461. The first exemplary structure includes a plurality of gate structures (561, 541, 152, 461) that are spaced apart from each other along the vertical direction. Each of the plurality of gate structures (561, 541, 152, 461) contacts a respective portion of the surface of the vertical semiconductor channel 60.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

Each of the backside gate dielectrics is located outside of the memory openings 49, and comprises a respective tubular portion of a backside gate dielectric layer 152 located between a respective neighboring pair of the insulating layers 32. Each ferroelectric material layer 54 is formed on a respective vertical stack of the backside gate dielectrics. Each backside gate dielectric layer 152 may include an upper horizontally-extending portion, a lower horizontally-extending portion, and a plurality of cylindrical portions that connect the upper horizontally-extending portion and the lower horizontally-extending portion and laterally surrounding a respective one of the memory opening fill structures 58.

Figure 20:
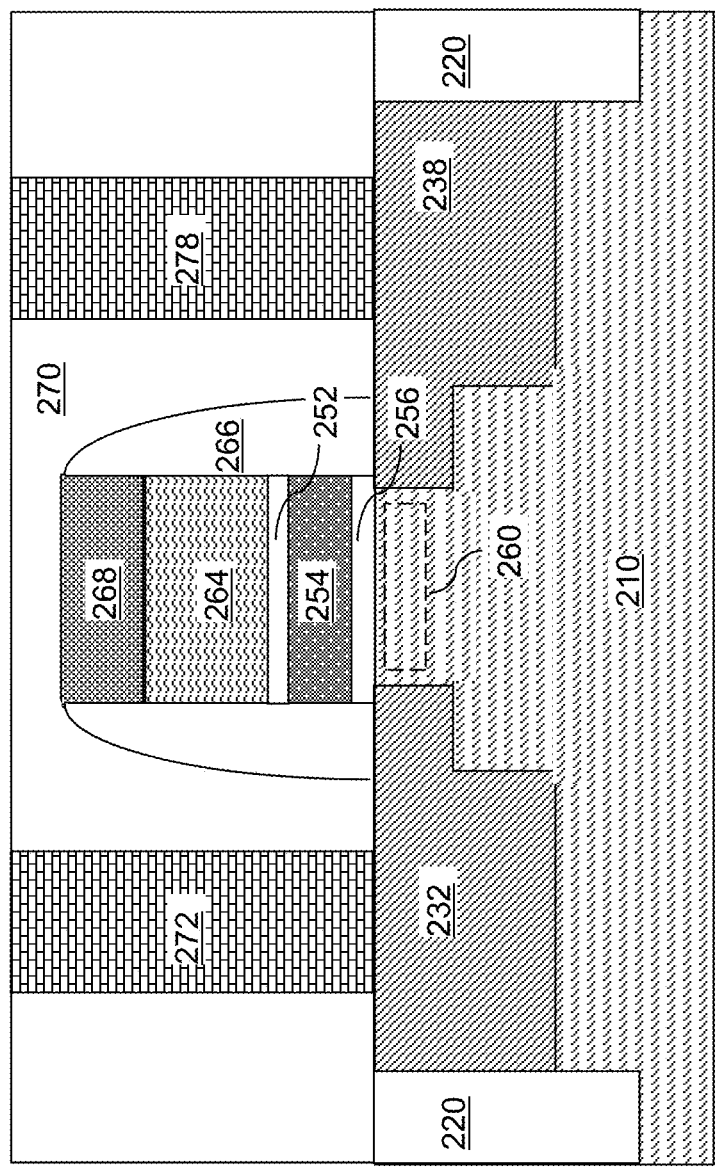
FIG. 20 is a schematic vertical cross-sectional view of a third exemplary structure according to a third embodiment of the present disclosure.

Referring to FIG. 20, a third exemplary structure according to a third embodiment of the present disclosure is illustrated. The third exemplary structure is a two dimensional horizontal memory transistor. The transistor includes a semiconductor material layer 210 located at, or on, an upper portion of a substrate, which may be a semiconductor substrate or a composite substrate including the semiconductor material layer 210 and at least one additional underlying material layer. The semiconductor material layer 210 may be the same silicon layer or doped silicon well as the semiconductor material layer 10 described above. The semiconductor material layer 210 may have a doping of a first conductivity type. Shallow trench isolation structures 220 including a dielectric material (such as silicon oxide) may be formed through upper portions of the semiconductor material layer 210 to define device regions, which are subsequently employed to form the field effect transistor.

At least one gate structure (256, 254, 252, 264, 268, 266) may be formed on a top surface of the semiconductor material layer 210. The at least one gate structure (256, 254, 252, 264, 268, 266) may be formed by sequentially depositing a gate layer stack including, from bottom to top, a front-side gate dielectric layer, a ferroelectric material layer, a backside gate dielectric layer, a gate electrode material layer, and a gate cap dielectric layer, and by patterning the layer stack to form patterned gate layer stack structures (256, 254, 252, 264, 268). The front-side gate dielectric layer may have the same thickness and the same material composition as the front-side gate dielectric layer 56 as described above. The ferroelectric material layer may have the same thickness and the same material composition as the ferroelectric material layer 54 as described above. The backside gate dielectric layer may have the same thickness and the same material composition as the backside gate dielectric layer 52 as described above. The gate electrode material layer may include a doped semiconductor material (such as p-doped polysilicon or n-doped polysilicon) and/or a metallic material (such as an elemental metal, an intermetallic alloy, a metal-semiconductor alloy such as a metal silicide, a conductive metal nitride, or a stack thereof). The thickness of the gate electrode material layer may be in a range from 50 nm to 300 nm, although lesser and greater thicknesses may also be employed. The gate cap dielectric layer includes a dielectric material such as silicon nitride, and may have a thickness in a range from 20 nm to 100 nm, although lesser and greater thicknesses may also be employed. A photoresist layer (not shown) may be applied over the gate layer stack, and may be lithographically patterned to cover areas having a respective uniform width, which corresponds to the gate length of a respective field effect transistor to be subsequently formed. An anisotropic etch may be performed to transfer the pattern in the photoresist layer though the gate layer stack. Each patterned portion of the gate layer stack constitutes a patterned gate layer stack structure (256, 254, 252, 264, 268).

Each patterned gate layer stack structure (256, 254, 252, 264, 268) includes, from bottom to top, a front-side gate dielectric 256, a ferroelectric material 254, a backside gate dielectric 252, a gate electrode 264, and a gate cap dielectric 268. Each front-side gate dielectric 256 is a patterned portion of the front-side gate dielectric layer, each ferroelectric material 254 is a patterned portion of the ferroelectric material layer, each backside gate dielectric 252 is a patterned portion of the backside gate dielectric layer, each gate electrode 264 is a patterned portion of the gate electrode material layer, and each gate cap dielectric 268 is a patterned portion of the gate cap dielectric layer. Ion implantation may be performed to implant dopants of the second conductivity type into surface portions of the semiconductor material layers 210 that are not masked by the patterned gate layer stack structures (256, 254, 252, 264, 268). Source and drain extension regions are formed in the implanted portions of the semiconductor material layer 10. The atomic concentration of dopants of the second conductivity type in the source/drain extension regions may be in a range from $1.0 \times 10^{18}/cm^3$ to $2.0 \times 10^{20}/cm^3$, although lesser and greater atomic concentrations may also be employed.

At least one dielectric material (such as silicon oxide and/or silicon nitride) may be conformally deposited and anisotropically etched to form gate spacers 266. Each gate spacer 266 includes at least one dielectric material and laterally surrounds a respective patterned gate layer stack structure (256, 254, 252, 264, 268). Each contiguous combination of a patterned gate layer stack structure (256, 254, 252, 264, 268) and a gate spacer 266 constitutes a gate structure (256, 254, 252, 264, 268, 266). Deep source/drain ion implantation may be performed to implant additional dopants of the second conductivity type into upper portions of the semiconductor material layer 210 that are not masked by the gate structures (256, 254, 252, 264, 268, 266). Deep source regions and deep drain regions are formed in implanted portions of the semiconductor material layer 210. The deep source regions and the deep drain regions may have a greater depth than the source/drain extension regions. The atomic concentration of dopants of the second conductivity type in the deep source regions and the deep drain regions may be in a range from $5.0 \times 10^{18}/cm^3$ to $2.0 \times 10^{21}/cm^3$, although lesser and greater atomic concentrations may also be employed. Each contiguous combination of a source extension region and a deep source region constitutes a source region 232. Each contiguous combination of a drain extension region and a deep drain region constitutes a drain region 238. A surface portion of semiconductor material layer 210 underlying a gate structure (256, 254, 252, 264, 268, 266) and located between a pair of a source region 232 and a drain region 238 constitutes a semiconductor channel 260.

A planarization dielectric layer 270 may be formed over the at least one gate structure (256, 254, 252, 264, 268, 266) and at least one pair of a source region 232 and a drain region 238. The planarization dielectric layer 270 includes a dielectric material such as silicon oxide, a porous or non-porous low dielectric constant (low-k) dielectric material, silicon nitride, a dielectric metal oxide, or a combination thereof. In one embodiment, the planarization dielectric layer 270 may include a planarizable dielectric material such as undoped silicate glass or a doped silicate glass, or may include a self-planarizing dielectric material such as flowable oxide (FOX). Via cavities may be formed through the planarization dielectric layer 270 to top surfaces of the source regions 232 and the drain regions 238. At least one conductive material (such as heavily doped silicon or at least one metallic material) may be deposited in the via cavities to form contact via structures, which include at least one source contact via structure (i.e., source electrode) 272 and at least one drain contact via structure (i.e., drain electrode) 278.

Figure 21:
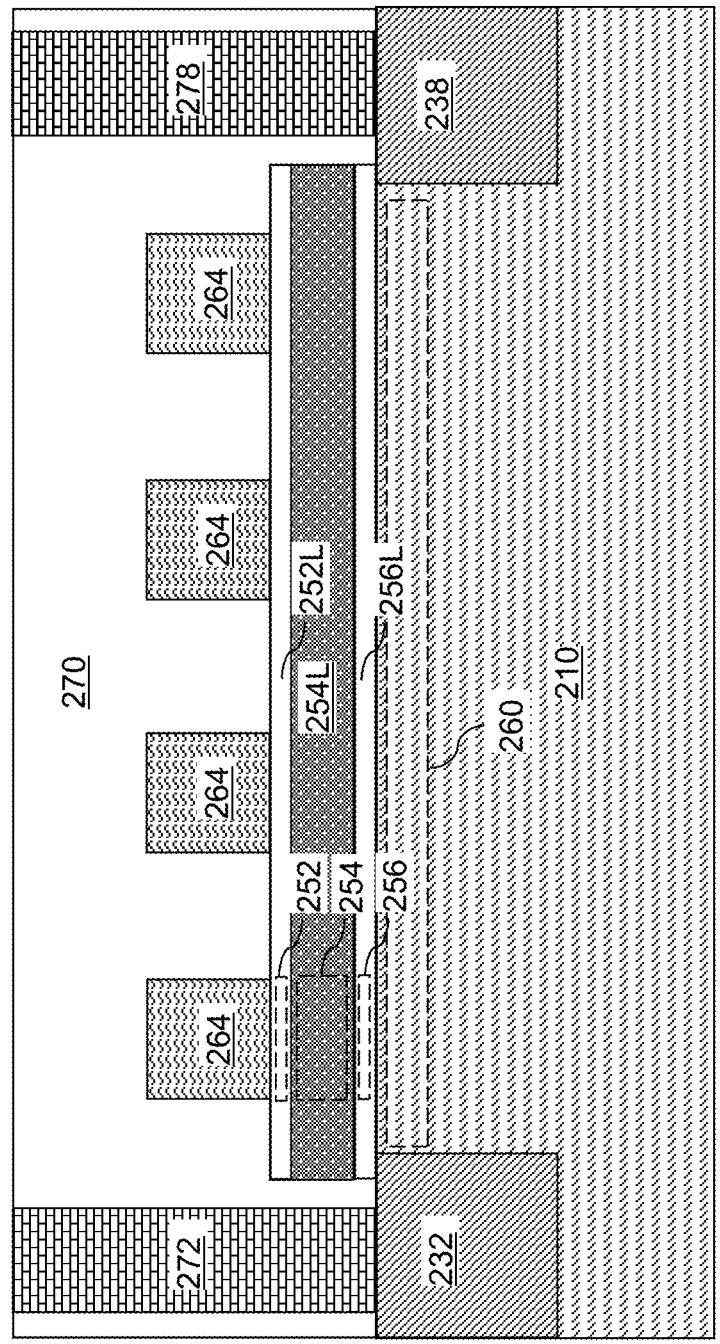
FIG. 21 is a schematic vertical cross-sectional view of a fourth exemplary structure according to a fourth embodiment of the present disclosure.

Referring to FIG. 21, a fourth exemplary structure according to a fourth embodiment of the present disclosure includes a two dimensional (e.g., horizontal) NAND string. The fourth exemplary structure may be derived from the third exemplary structure by forming multiple gate electrodes 264 over a layer stack of a front-side gate dielectric layer 256L, a ferroelectric material layer 254L, and a backside gate dielectric layer 252L. For example, a blanket front-side gate dielectric layer, a blanket ferroelectric material layer, a blanket backside gate dielectric layer, and a blanket gate electrode material layer may be deposited over a top surface of the semiconductor material layer 210. Optionally, a blanket gate cap dielectric layer may be formed over the blanket gate electrode material layer. As used herein, a blanket material layer refers to a continuous unpatterned material layer.

The stack of the blanket front-side gate dielectric layer, the blanket ferroelectric material layer, the blanket backside gate dielectric layer, and the blanket gate electrode material layer may be patterned to continuously cover an area between an area in which a source region 232 is to be subsequently formed and an area in which a drain region 238 is to be subsequently formed. A remaining portion of the blanket front-side gate dielectric layer constitutes a front-side gate dielectric layer 256L. A remaining portion of the blanket ferroelectric material layer constitutes a ferroelectric material layer 254L. A remaining portion of the blanket backside gate dielectric layer constitutes a backside gate dielectric layer 252L. A remaining portion of the blanket gate electrode material layer constitutes a patterned gate electrode material layer.

Dopants of the second conductivity type may be implanted into surface portions of the semiconductor material layer 210 to form a source region 232 and a drain region 238. Gate spacers (not illustrated) and/or multiple ion implantation steps may be optionally employed to provide suitable dopant concentration profiles in the source region 232 and in the drain region 238. A surface portion of the semiconductor material layer 210 that laterally extends between the source region 232 and the drain region 238 constitutes a semiconductor channel 260.

The patterned gate electrode material layer may be subsequently patterned into multiple gate electrodes 264. For example, a photoresist layer may be applied over the patterned gate electrode material layer, and may be lithographically patterned to cover multiple discrete portions of the patterned gate electrode material layer between the source region 232 and the drain region 238. The width of each patterned portion of the photoresist layer along the channel direction (i.e., the direction laterally connecting the source region 232 and the drain region 238) may be uniform, and the width of each spacing between a neighboring pair of patterned portions of the photoresist layer may be uniform. The pattern in the photoresist layer may be transferred through the patterned gate electrode material layer by an anisotropic etch process, and divides the patterned gate electrode material layer into multiple discrete portions. The anisotropic etch process may terminate at the top surface of, within, or at the bottom surface of, the backside gate dielectric layer 262L. Each patterned portion of the gate electrode material layer constitutes a gate electrode 264.

Each portion of the backside gate dielectric layer 252L that underlies a gate electrode 264 constitutes a backside gate dielectric 252. Each portion of the ferroelectric material layer 254L that underlies a gate electrode 264 constitutes a ferroelectric material portion 254. Each portion of the front-side gate dielectric layer 256L that underlies a gate electrode 264 constitutes a front-side gate dielectric 256. Each front-side gate dielectric 256 may have the same material composition and the same thickness as a front-side gate dielectric (561, 256) of previously described embodiments. Each ferroelectric material portion 254 may have the same material composition and the same thickness as a ferroelectric material portion (541, 254) of previously described embodiments. Each backside gate dielectric 256 may have the same material composition and the same thickness as a backside gate dielectric (521, 152, 252) of previously described embodiments. Each gate structure (256, 254, 252, 264) includes a vertical stack that includes, from bottom to top, a front-side gate dielectric 256, a ferroelectric material portion 254, a backside gate dielectric 252, and a gate electrode 264.

A planarization dielectric layer 270 may be formed over the at least one gate structure (256, 254, 252, 264, 268, 266) and at least one pair of a source region 232 and a drain region 238. The planarization dielectric layer 270 includes a dielectric material such as silicon oxide, a porous or non-porous low dielectric constant (low-k) dielectric material, silicon nitride, a dielectric metal oxide, or a combination thereof. Via cavities may be formed through the planarization dielectric layer 270 to top surfaces of the source regions 232 and the drain regions 238. At least one conductive material (such as heavily doped silicon or at least one metallic material) may be deposited in the via cavities to form contact via structures, which include at least one source contact via structure 272 and at least one drain contact via structure 278. Select transistor gate electrodes (not shown for clarity) may also be formed between the source and drain regions (232, 238) and the respective adjacent gate structures (256, 254, 252, 264, optionally 268, optionally 266).

Referring collectively to FIGS. 20 and 21, a field effect transistor including at least one gate structure (256, 254, 252, 264, optionally 268, optionally 266) may be formed on a semiconductor material layer 210. A semiconductor channel 260 may comprise a horizontally-extending surface portion of a semiconductor material layer 210 located within, or on, a substrate. Each of the at least one gate structure (256, 254, 252, 264, optionally 268, optionally 266) is formed on a horizontal top surface of the semiconductor channel 260.

In one embodiment, a dielectric gate spacer 266 may contact sidewalls of the first-side gate dielectric 256, the ferroelectric material portion 254, the backside gate dielectric 256, and the gate electrode 264, and may contact the source region 232 and the drain region 238 as illustrated in FIG. 20. A planarization dielectric layer 270 may laterally surround the dielectric gate spacer 266. A source contact via structure 272 may contact the source region 232, and may be embedded in the planarization dielectric layer 270. A drain contact via structure 278 may contact the drain region 238, and may be embedded in the planarization dielectric layer 270. In one embodiment, a plurality of gate structures (256, 254, 252, 264) may be formed between the source region 232 and the drain region 238.

Generally speaking, ferroelectric memory devices as known in the art encounter charge trapping problems in the ferroelectric material during write cycles, which counteracts polarization switching and degrades operational window for the ferroelectric memory devices. Particularly, hafnium oxide and hafnium zirconium oxide have a high density of defects, and a significant amount of charge trapping is induced by write pulses and erase pulses. In addition, a charge release process that follows charge trapping limits the operational speed of ferroelectric memory devices known in the art. Such problems cause insufficient remnant polarization, reduction of the operational window, and reduction of device endurance.

The various embodiments of the present disclosure provide a method for improving remnant polarization, operational window of the memory device, and endurance and reliability by a "double confinement" configuration of each ferroelectric cell. The double confinement is provided by employing a first dielectric metal oxide material for the front-side gate dielectric having a higher band gap than the band gap of the ferroelectric material of the ferroelectric memory element, and by employing a second dielectric metal oxide material for the backside gate dielectric having a higher band gap than the band gap of the ferroelectric material of the ferroelectric memory element. The front-side gate dielectric provides energy band confinement at an interface with a semiconductor channel (60, 260), and the backside gate dielectric provides energy band confinement at an interface with a gate electrode (46, 264). The double confinement configuration of the embodiments of the present disclosure provides reduced charge trapping during operation, thereby improving device operational window, performance and reliability.

Figures 22A, 22B:
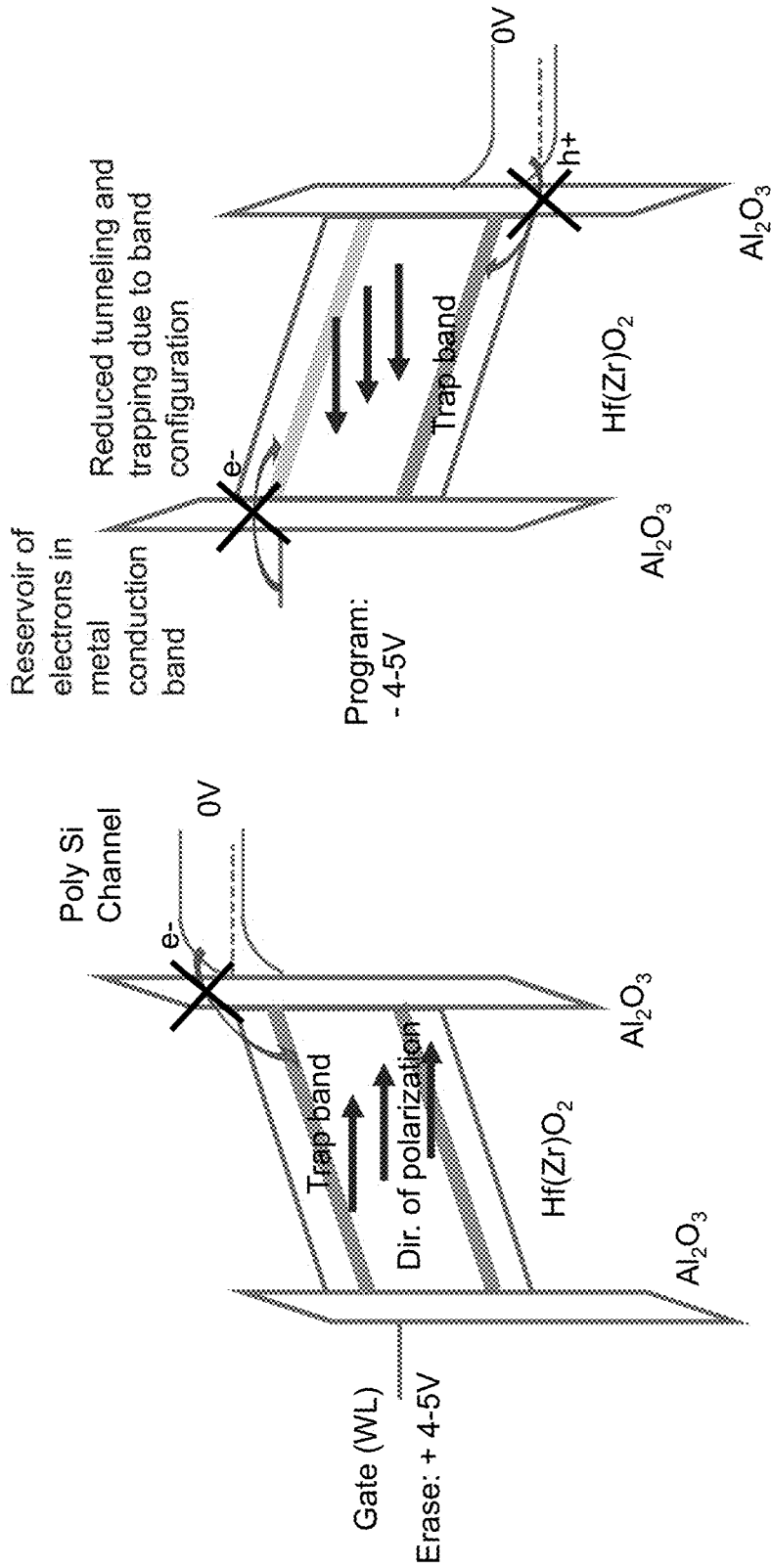
FIG. 22A is a band diagram of a ferroelectric memory element during an erase operation according to an embodiment of the present disclosure.
FIG. 22B is a band diagram of a ferroelectric memory element during a programming operation according to an embodiment of the present disclosure.

FIG. 22A illustrates a band diagram of a ferroelectric memory element of the present disclosure during an erase operation according to an embodiment of the present disclosure. FIG. 22B illustrates a band diagram of a ferroelectric memory element during a programming operation according to an embodiment of the present disclosure. FIGS. 22A and 22B illustrate the advantages of the double confinement configuration. For an illustrative purpose, FIGS. 22A and 22B illustrate a case in which the ferroelectric material portion (541, 254) includes a hafnium zirconium oxide, the first dielectric metal oxide material of the front-side gate dielectric (561, 256) includes aluminum oxide, and the second dielectric metal oxide material of the backside gate dielectric (521, 152, 252) includes aluminum oxide. As discussed above, the first dielectric metal oxide material of the front-side gate dielectric (561, 256) and the second dielectric metal oxide material of the backside gate dielectric (521, 152, 252) have larger band gaps than the band gap of the ferroelectric material portion (541, 254). Large conduction band offsets and valence band offsets of interlayer films (i.e., the front-side gate dielectric (561, 256) and the backside gate dielectric (521, 252)) limit carrier tunneling into, and trapping within, the ferroelectric material portion (541, 254), and thus, improve performance and reliability of the ferroelectric memory element.

Specifically, the front-side gate dielectric (561, 256) decreases charge trapping in the ferroelectric material portion (541, 254) by inducing an energy level offset between the Fermi level within the semiconductor channel (60, 260) and the energy level of the trap band in the ferroelectric material portion (542, 254) as illustrated in FIG. 22A. In the case of a stack including aluminum oxide, hafnium zirconium oxide, and aluminum oxide, the conduction band offset between the silicon channel and aluminum oxide front-side gate dielectric is greater than the conductive band offset between silicon and hafnium oxide by about 1.0 eV~1.3 eV. Thus, the aluminum oxide material in the front-side gate dielectric (561, 256) generates an additional energy barrier, thereby limiting electron tunneling from the semiconductor channel (60, 260) into the ferroelectric material portion (541, 254), and thus reducing electron trapping in the ferroelectric material portion (541, 254).

Reduction of charge trapping in the ferroelectric material portion (541, 254) is provided by the backside gate dielectric (521, 152, 252) as illustrated in FIG. 22B. The backside gate dielectric (521, 152, 252) functions as additional potential barrier for electrons in the gate electrode (461, 264) for the purpose of tunneling. Reducing electron trapping from gate side during programming improves the operational window of the ferroelectric memory device of the embodiments of the present disclosure.

Referring to all drawings and according to various embodiments of the present disclosure, a semiconductor structure contains a semiconductor channel {(59, 11, 60), 260} extending between a source region (61, 232) and a drain region (63, 238), at least one gate electrode (461, 264), a ferroelectric material portion (541, 254) located between the semiconductor channel and the at least one gate electrode, a front-side gate dielectric (561, 256) located between the ferroelectric material portion and the semiconductor channel, and a backside gate dielectric (521, 152, 252) located between the ferroelectric material portion and the at least one gate electrode. The front-side gate dielectric and the backside gate dielectric have a dielectric constant greater than 7.9 and a band gap greater than a band gap of the ferroelectric material portion.

In one embodiment, the ferroelectric material portion comprises non-centrosymmetric doped or undoped hafnium oxide (such as zirconium doped hafnium oxide) having an orthorhombic phase, the backside gate dielectric comprises aluminum oxide, and the front-side gate dielectric comprises aluminum oxide.

In one embodiment, a front surface of the ferroelectric material portion (541, 254) contacts the front-side gate dielectric (561, 256), and a backside surface of the ferroelectric material portion (541, 254) contacts the backside gate dielectric (521 or 152, 252).

In one embodiment, the at least one gate electrode 264 comprises a plurality of gate electrodes (461, 264) that are spaced apart from each other, and located between the source region (61, 232) and the drain region (63, 238).

In one embodiment, the semiconductor structure comprises an alternating stack of insulating layers 32 and electrically conductive layers 46 located on a substrate (9, 10). Each semiconductor channel (59, 11, 60) comprises at least a vertically extending portion 60 which vertically extends through the electrically conductive layers 46, and each gate electrode 461 of the plurality of gate electrodes comprises a respective portion of a respective one of the electrically conductive layers 46.

In one embodiment, the semiconductor structure comprises a plurality of memory openings 49 vertically extending through the alternating stack (32, 46). Each vertically extending portion 60 of each semiconductor channel (59, 11, 60) is located within a respective one of the memory openings 49. Each of the front-side gate dielectrics 561 comprises a portion of a respective front-side gate dielectric layer 56 laterally surrounding, and contacting, a respective one of the semiconductor channels (59, 11, 60). Each of the ferroelectric material portions 541 comprises a portion of a respective ferroelectric material layer 54 laterally surrounding, and contacting, a respective one of the front-side gate dielectric layers 56.

In the first embodiment, each of the backside gate dielectrics 521 comprises a portion of a respective backside gate dielectric layer 52 laterally surrounding, and contacting, a respective one of the ferroelectric material layers 54.

In the second embodiment, each of the backside gate dielectrics is located outside of the memory openings 49, and comprises a respective tubular portion of a backside gate dielectric layer 152 located between a respective vertically neighboring pair of the insulating layers 32.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

In the third and fourth embodiments, the semiconductor channel comprises a horizontally-extending surface portion (such as a horizontal semiconductor channel 60 or a semiconductor channel 260) of a semiconductor material layer (10 or 210) located within or on a substrate.

In the third embodiment, the semiconductor structure comprises: a dielectric gate spacer 266 contacting sidewalls of the first-side gate dielectric 256, the ferroelectric material portion 254, the backside gate dielectric 252, and the gate electrode 264, and contacting the source region 232 and the drain region 238; a planarization dielectric layer 270 laterally surrounding the dielectric gate spacer 266; a source contact via structure 272 contacting the source region 232 and embedded in the planarization dielectric layer 270; and a drain contact via structure 278 contacting the drain region 239 and embedded in the planarization dielectric layer 270.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
an alternating stack of insulating layers and electrically conductive layers located over a semiconductor material layer, wherein the electrically conductive layers comprise gate electrodes;
a memory opening vertically extending from a topmost surface of the alternating stack at least to the semiconductor material layer;
a memory opening fill structure located in the memory opening and comprising a vertical semiconductor channel, a front-side gate dielectric layer laterally surrounding an upper portion of the vertical semiconductor channel, and a ferroelectric material layer in direct contact with an outer sidewall of the front-side gate dielectric layer and in direct contact with a lower portion of the vertical semiconductor channel; and
a backside gate dielectric located between the ferroelectric material layer and the electrically conductive layers,
wherein the front-side gate dielectric layer and the backside gate dielectric have a dielectric constant greater than 7.9 and a band gap greater than a band gap of the ferroelectric material layer.

2. The semiconductor structure of claim 1, wherein:
the ferroelectric material layer comprises non-centrosymmetric doped or undoped hafnium oxide having an orthorhombic phase;
the backside gate dielectric comprises aluminum oxide; and
the front-side gate dielectric layer comprises aluminum oxide.

3. The semiconductor structure of claim 2, wherein the ferroelectric material layer comprises non-centrosymmetric zirconium doped hafnium oxide having the orthorhombic phase.

4. The semiconductor structure of claim 1, wherein the backside gate dielectric comprises a portion of a backside gate dielectric layer laterally surrounding, and contacting, the ferroelectric material layer.

5. The semiconductor structure of claim 1, wherein the backside gate dielectric comprises a backside gate dielectric layer located outside of the memory opening.

6. The semiconductor structure of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces of the alternating stack and through a retro-stepped dielectric material portion that overlies the stepped surfaces of the alternating stack.

7. The semiconductor structure of claim 1, wherein:
the semiconductor material layer comprises a horizontal semiconductor channel having a doping of a first conductivity type; and
the semiconductor material layer embeds a source region having a doping of a second conductivity type that is opposite of the first conductivity type.

8. The semiconductor structure of claim 7, wherein:
a drain region having a doping of the second conductivity type is located on a top end of the vertical semiconductor channel; and
a semiconductor channel comprising the horizontal semiconductor channel and the vertical semiconductor channel extends between the source region and the drain region.

9. The semiconductor structure of claim 1, wherein an outer sidewall of the front-side gate dielectric layer continuously extends vertically through a plurality of electrically conductive layers of the electrically conductive layers, and an entirety of the outer sidewall of the front-side gate dielectric layer is in direct contact within an inner sidewall of the ferroelectric material layer.

10. The semiconductor structure of claim 9, wherein the ferroelectric material layer continuously extends vertically through the plurality of electrically conductive layers of the electrically conductive layers, and an entirety of an outer sidewall of the ferroelectric material layer in direct contact with an inner sidewall of the backside gate dielectric.

11. A method of forming a semiconductor structure, comprising:
forming a source region, a drain region, and a semiconductor channel extending between the source region and the drain region;
forming a stack including, from one side to another, a front-side gate dielectric, a ferroelectric material portion, and a backside gate dielectric such that the semiconductor channel is in direct contact with the front-side gate dielectric and a surface segment of the ferroelectric material portion; and
forming a gate electrode on the backside gate dielectric, wherein the front-side gate dielectric and the backside gate dielectric have a dielectric constant greater than 7.9 and a band gap greater than a band gap of the ferroelectric material portion.

12. The method of claim 11, wherein:
the ferroelectric material portion comprises non-centrosymmetric doped or undoped hafnium oxide having an orthorhombic phase;
the backside gate dielectric comprises aluminum oxide; and
the front-side gate dielectric comprises aluminum oxide.

13. The method of claim 11, further comprising a plurality of gate electrodes that are spaced apart from each other and located between the source region and the drain region.

14. A method of forming a semiconductor structure, comprising:
forming an alternating stack of insulating layers and sacrificial material layers over a semiconductor material layer;

forming a memory opening through the alternating stack to the semiconductor material layer;

forming a memory opening fill structure in the memory opening, wherein the memory opening fill structure comprises a ferroelectric material layer, a front-side gate dielectric layer, and a vertical semiconductor channel that is formed directly on an inner sidewall of the front-side gate dielectric layer and directly on a cylindrical surface segment of the ferroelectric material layer;

forming backside recesses by removing the sacrificial material layers selective to the insulating layers and the memory opening fill structure;

forming a backside gate dielectric either as a backside gate dielectric layer that is deposited on a sidewall of the memory opening prior to deposition of the ferroelectric material layer, or as portions of a dielectric material layer that is deposited in the backside recesses on physically exposed portions of the ferroelectric material layer; and forming electrically conductive layers in remaining volumes of the backside recesses, wherein the front-side gate dielectric layer and the backside gate dielectric have a dielectric constant greater than 7.9 and a band gap greater than a band gap of the ferroelectric material layer.

15. The method of claim 14, wherein:

the vertical semiconductor channel is formed by depositing a semiconductor channel layer directly on a semiconductor material portion underlying the ferroelectric material layer, and removing portions of the semiconductor channel layer from outside a volume of the memory opening; and the semiconductor material portion comprises a portion of the semiconductor material layer or a pedestal channel portion that is deposited on a top surface of the semiconductor material layer at a bottom portion of the memory opening prior to formation of the ferroelectric material layer.

\* \* \* \* \*